United States Patent
Lai

(10) Patent No.: US 11,605,606 B2
(45) Date of Patent: Mar. 14, 2023

(54) SEMICONDUCTOR DEVICE WITH SPACER OVER BONDING PAD

(71) Applicant: NANYA TECHNOLOGY CORPORATION, New Taipei (TW)

(72) Inventor: Chun-Chi Lai, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/572,793

(22) Filed: Jan. 11, 2022

(65) Prior Publication Data
US 2022/0130779 A1  Apr. 28, 2022

Related U.S. Application Data

(62) Division of application No. 16/674,337, filed on Nov. 5, 2019, now Pat. No. 11,521,945.

(51) Int. Cl.
*H01L 23/00* (2006.01)
*H01L 23/522* (2006.01)
(Continued)

(52) U.S. Cl.
CPC .......... *H01L 24/05* (2013.01); *H01L 21/7682* (2013.01); *H01L 21/76885* (2013.01); *H01L 23/5226* (2013.01); *H01L 23/53295* (2013.01); *H01L 24/03* (2013.01); *H01L 24/13* (2013.01); *H01L 29/41725* (2013.01); *H01L 29/4236* (2013.01); *H01L 2224/0217* (2013.01); *H01L 2224/0219* (2013.01); *H01L 2224/02181* (2013.01); *H01L 2224/02185* (2013.01); *H01L 2224/02206* (2013.01);
(Continued)

(58) Field of Classification Search
CPC ...................... H01L 2224/0218–02181; H01L 2224/022–02206; H01L 2224/1191; H01L 23/564
See application file for complete search history.

(56) References Cited

U.S. PATENT DOCUMENTS

| | | |
|---|---|---|
| 2003/0235980 A1 | 12/2003 | Huang et al. |
| 2006/0166402 A1 | 7/2006 | Lim et al. |
| 2011/0169161 A1 | 7/2011 | Yuzawa et al. |

OTHER PUBLICATIONS

Office Action dated Jul. 5, 2022 related to U.S. Appl. No. 16/674,337, wherein this application is a DIV of U.S. Appl. No. 16/674,337.
(Continued)

*Primary Examiner* — Amar Movva
(74) *Attorney, Agent, or Firm* — Xuan Zhang

(57) ABSTRACT

The present application provides a semiconductor device. The semiconductor device includes a bonding pad disposed over a semiconductor substrate; a first spacer disposed over a top surface of the bonding pad; a second spacer disposed over a sidewall of the bonding pad; a dielectric layer between the bonding pad and the semiconductor substrate. The dielectric layer includes silicon-rich oxide; and a conductive bump disposed over the first passivation layer. The conductive bump is electrically connected to a source/drain (S/D) region in the semiconductor substrate through the bonding pad. The semiconductor device also includes a dielectric liner disposed between the first spacer and the bonding pad; and a first passivation layer covering the second spacer, wherein the dielectric liner is L-shaped, and the first spacer is separated from the bonding pad by the dielectric liner.

11 Claims, 28 Drawing Sheets

(51) Int. Cl.
*H01L 23/532* (2006.01)
*H01L 21/768* (2006.01)
*H01L 29/417* (2006.01)
*H01L 29/423* (2006.01)

(52) U.S. Cl.
CPC ............... *H01L 2224/02215* (2013.01); *H01L 2224/03019* (2013.01); *H01L 2224/0391* (2013.01); *H01L 2224/0401* (2013.01); *H01L 2224/05007* (2013.01); *H01L 2224/05573* (2013.01); *H01L 2224/10135* (2013.01)

(56) References Cited

OTHER PUBLICATIONS

Office Action dated Mar. 3, 2022 related to U.S. Appl. No. 16/674,337, wherein this application is a DIV of U.S. Appl. No. 16/674,337.

SEMICONDUCTOR DEVICE WITH SPACER OVER BONDING PAD

CROSS-REFERENCE TO RELATED APPLICATION

This application is a divisional application of U.S. Non-Provisional application Ser. No. 16/674,337 filed Nov. 5, 2019, which is incorporated herein by reference in its entirety.

TECHNICAL FIELD

The present disclosure relates to a semiconductor device, and more particularly, to a semiconductor device with a spacer over a bonding pad.

DISCUSSION OF THE BACKGROUND

Semiconductor devices are essential for many modern applications. With the advancement of electronic technology, semiconductor devices are becoming smaller in size while providing greater functionality and comprising greater amounts of integrated circuitry. Due to the miniaturized scale of semiconductor devices, various types and dimensions of semiconductor devices performing different functions are integrated and packaged into a single module. Furthermore, numerous manufacturing operations are implemented for integration of various types of semiconductor devices.

However, the manufacturing and integration of semiconductor devices involve many complicated steps and operations. An increase in complexity of manufacturing and integration of the semiconductor device may cause deficiencies such as poor electrical interconnection, misalignment of bonding components, or moisture-induced deterioration. Accordingly, there is a continuous need to improve the structure and the manufacturing process of semiconductor devices.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device is provided. The semiconductor device includes a bonding pad disposed over a semiconductor substrate; a first spacer disposed over a top surface of the bonding pad; a second spacer disposed over a sidewall of the bonding pad; a dielectric layer between the bonding pad and the semiconductor substrate, wherein the dielectric layer includes silicon-rich oxide; and a conductive bump disposed over the first passivation layer, wherein the conductive bump is electrically connected to a source/drain (S/D) region in the semiconductor substrate through the bonding pad.

In some embodiments, the semiconductor device further comprises a dielectric liner disposed between the first spacer and the bonding pad; and a first passivation layer covering the second spacer.

In some embodiments, the dielectric liner is L-shaped, and the first spacer is separated from the bonding pad by the dielectric liner.

In some embodiments, the semiconductor device further comprises a barrier layer disposed between the bonding pad and the dielectric layer, wherein the second spacer is in direct contact with the barrier layer and the dielectric layer.

In some embodiments, the semiconductor device further comprises an anti-reflection coating layer disposed over the bonding pad; and a third spacer disposed over the second spacer and in direct contact with the anti-reflection coating layer, wherein the anti-reflection coating layer and the third spacer are covered by the first passivation layer.

In some embodiments, a bottommost surface of the third spacer is level with or higher than a bottommost surface of the second spacer.

In some embodiments, the semiconductor device further comprises a second passivation layer between the first passivation layer and the bonding pad, wherein the second spacer is covered by the second passivation layer, and a portion of the conductive bump is surrounded by the first passivation layer and the second passivation layer.

In some embodiments, the semiconductor device further comprises a conductive via between the bonding pad and the S/D region, wherein the conductive via is surrounded by an air gap.

In one embodiment of the present disclosure, a semiconductor device is provided. The semiconductor device includes a bonding pad disposed over a semiconductor substrate; a first spacer disposed over a top surface of the bonding pad; a second spacer disposed over a sidewall of the bonding pad; a third spacer disposed over the second spacer; a first dielectric layer between the bonding pad and the semiconductor substrate, wherein the dielectric layer includes silicon-rich oxide; and a conductive bump disposed over the bonding pad, wherein the conductive bump extends over the first passivation layer and is electrically connected to a source/drain (S/D) region in the semiconductor substrate.

In some embodiments, the semiconductor device further comprises a dielectric liner disposed between the first spacer and the bonding pad; and a first passivation layer covering the second spacer.

In some embodiments, the dielectric liner is L-shaped, and the first spacer is separated from the bonding pad by the dielectric liner.

In some embodiments, the semiconductor device further comprises a second passivation layer between the bonding pad and the first passivation layer, wherein the second spacer is separated from the second passivation layer by the third spacer.

In some embodiments, the second spacer and the third spacer are in direct contact with the first dielectric layer.

In some embodiments, the second spacer is L-shaped, and the third spacer is separated from the first dielectric layer by the second spacer.

In some embodiments, the semiconductor device further comprises a second dielectric layer formed between the first dielectric layer and the semiconductor substrate; a third dielectric layer formed between the second dielectric layer and the semiconductor substrate, wherein a silicon content of the second dielectric layer is greater than a silicon content of the third dielectric layer; and a conductive via formed in the third dielectric layer, wherein an air gap is between the conductive via and the third dielectric layer.

In one embodiment of the present disclosure, a semiconductor device is provided. The semiconductor device includes a bonding pad disposed over a semiconductor substrate; a first upper spacer disposed over a top surface of the bonding pad; a second upper spacer disposed over the first upper spacer; a first sidewall spacer disposed over a sidewall of the bonding pad; a dielectric layer between the bonding pad and the semiconductor substrate, wherein the dielectric layer includes silicon-rich oxide; and a conductive bump disposed over the first passivation layer, wherein the conductive bump is electrically connected to a source/drain (S/D) region in the semiconductor substrate through the bonding pad.

In some embodiments, the semiconductor device further comprises an anti-reflection coating layer disposed over the bonding pad; and a second sidewall spacer disposed over the first sidewall spacer and in direct contact with the anti-reflection coating layer, wherein the anti-reflection coating layer and the second sidewall spacer are covered by the first passivation layer.

In some embodiments, a bottommost surface of the second sidewall spacer is level with or higher than a bottommost surface of the first sidewall spacer.

In some embodiments, the semiconductor device further comprises a second passivation layer between the first passivation layer and the bonding pad, wherein the first sidewall spacer is covered by the second passivation layer, and a portion of the conductive bump is surrounded by the first passivation layer and the second passivation layer.

In some embodiments, the semiconductor device further comprises a conductive via between the bonding pad and the S/D region, wherein the conductive via is surrounded by an air gap.

Embodiments of a semiconductor device are provided in accordance with some embodiments of the disclosure. The semiconductor device includes a second spacer over a sidewall of a bonding pad, a first passivation layer covering the bonding pad and the second spacer, and a conductive bump over the first passivation layer and electrically connected to a source/drain region in an underlying semiconductor substrate through the bonding pad. As a result of such configuration, short circuit problems caused by misalignment of the bonding pad and the conductive bump may be prevented by the second spacer. Accordingly, the overall device performance may be improved, and the yield rate of the semiconductor device may be increased.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
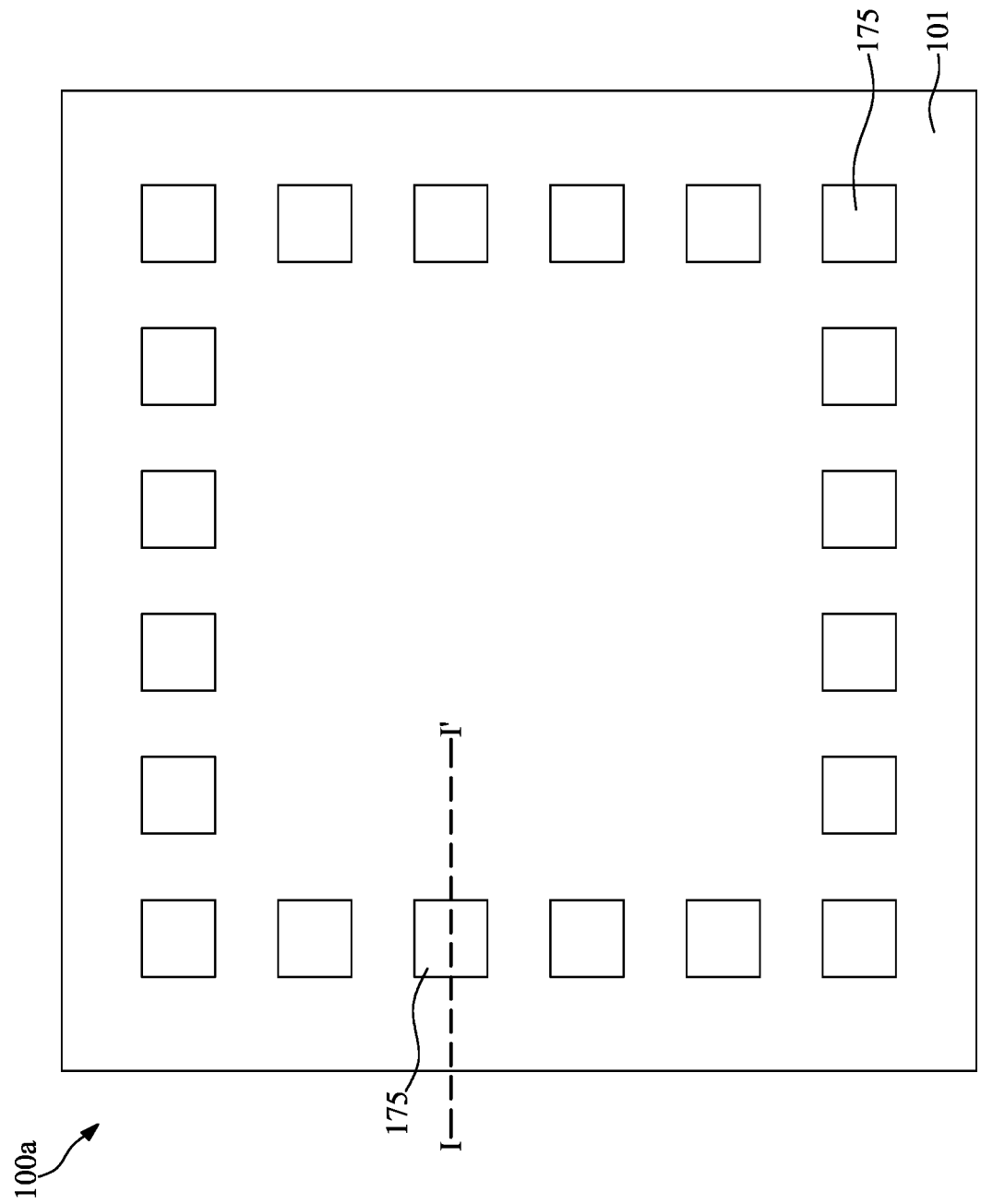
FIG. 1 is a top view illustrating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a layout illustrating a semiconductor device 100a, in accordance with some embodiments. As shown in FIG. 1, the semiconductor device 100a includes a plurality of bonding pads 175 disposed over a semiconductor substrate 101, in accordance with some embodiments. More specifically, the bonding pads 175 are arranged along a peripheral region of the semiconductor substrate 101, and the peripheral region surrounds a central region of the semiconductor substrate 101. In some embodiments, a plurality of transistors are disposed in the central region, and the bonding pads 175 are used to electrically connect the transistors to external devices through wire bonding.

Figure 2:
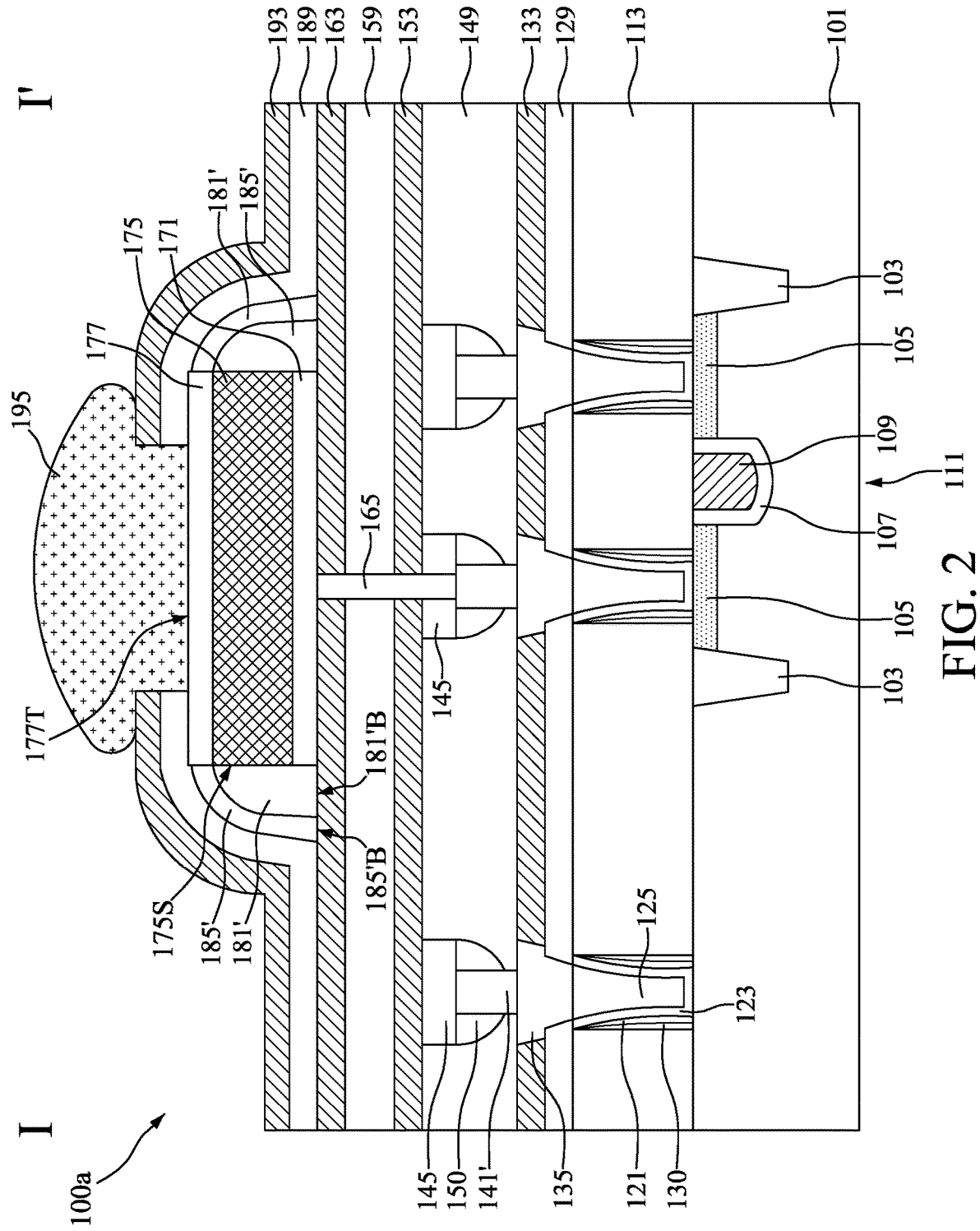
FIG. 2 is a cross-sectional view illustrating the semiconductor device along a sectional line I-I' in FIG. 1, in accordance with some embodiments.

FIG. 2 is a cross-sectional view illustrating the semiconductor device 100a along a sectional line I-I' in FIG. 1, in accordance with some embodiments. In some embodiments, the semiconductor device 100a includes an active region defined by isolation structures 103 in the semiconductor substrate 101, wherein source/drain (S/D) regions 105 and a gate structure 111 are formed in the active region. The gate structure 111 is embedded in the semiconductor substrate 101 and between the S/D regions 105, in accordance with some embodiments. However, in some other embodiments, the gate structure 111 is formed over the semiconductor substrate 101. Moreover, the gate structure 111 may include a gate electrode 109 and a gate dielectric layer 107 surrounding and covering the bottom surface of the gate electrode 109.

In addition, the semiconductor device 100a includes an interconnection structure between the bonding pad 175 and the semiconductor substrate 101. The interconnection structure is embedded in dielectric layers 113, 129, 133, 149, 153, 159 and 163, which are stacked from bottom to top as shown in FIG. 2 in accordance with some embodiments. In some embodiments, conductive vias 125 are formed in the dielectric layer 113, sidewalls and bottom surfaces of the conductive vias 125 are covered by barrier layers 123, sidewalls of the barrier layers 123 are covered by second inner spacers 121, and air gaps 130 are formed between the second inner spacers 121 and the dielectric layer 113.

In some embodiments, conductive structures 135 are formed in the dielectric layers 129 and 133. Specifically, lower portions of the conductive structures 135 are surrounded by the dielectric layer 129, and upper portions of the conductive structures 135 are surrounded by the dielectric layer 133. In some embodiments, conductive vias 141' and dielectric portions 145 are formed in the dielectric layer 149, and air gaps 150 are formed between the conductive vias 141' and the dielectric layer 149. Specifically, the conductive vias 141' are surrounded by the air gaps 150, and the air gaps 150 are covered by the dielectric portions 145, in accordance with some embodiments.

Furthermore, in some embodiments, a conductive via 165 is formed, wherein the conductive via 165 penetrates through the dielectric layers 153, 159 and 163 and the dielectric portion 145. In some embodiments, the silicon contents of the dielectric layers 133, 153 and 163 are greater than the silicon contents of the dielectric layers 113, 129, 149 and 159. For example, the dielectric layers 133, 153 and 163 include silicon-rich oxide (SRO), which has a low moisture absorption rate. Therefore, the dielectric layers 133, 153 and 163 may protect underlying structures from being contaminated by external moisture.

Still referring to FIG. 2, in some embodiments, a barrier layer 171 is formed between the bonding pad 175 and the abovementioned interconnection structure, and an anti-reflective coating layer 177 is formed over the bonding pad 175. In some embodiments, sidewalls of the barrier layer 171, sidewalls 175S of the bonding pad 175 and sidewalls of the anti-reflective coating layer 177 are aligned, and second spacers 181' and third spacers 185' are formed over the sidewalls of the barrier layer 171, the bonding pad 175 and the anti-reflective coating layer 177.

Specifically, the second spacers 181' cover the sidewalls of the barrier layer 171 and the sidewalls 175S of the bonding pad 175, and the third spacers 185' are formed over the second spacers 181', in accordance with some embodiments. In some embodiments, the third spacers 185' cover the sidewalls of the anti-reflective coating layer 177. It should be noted that the sidewalls 175S of the bonding pad 175 are in direct contact with the second spacers 181', in accordance with some embodiments.

In some embodiments, the semiconductor device 100a further includes passivation layers 189 and 193 conformally covering the dielectric layer 163, the third spacers 185' and the anti-reflective coating layer 177, and a top surface 177T of the anti-reflective coating layer 177 is partially exposed through the passivation layers 189 and 193. A conductive bump 195 is formed over the top surface 177T of the anti-reflective coating layer 177 and extends onto the passivation layers 189 and 193.

It should be noted that, in some embodiments, the passivation layer 193 is formed over the passivation layer 189, and the silicon content of the passivation layer 193 is greater than the silicon content of the passivation layer 189 (e.g., the passivation layer 193 includes silicon-rich oxide (SRO)), so that the passivation layer 193 may protect the underlying structure from being contaminated by external moisture. Additionally, the conductive bump 195 is in direct contact with the top surface 177T of the anti-reflective coating layer 177, and a lower portion of the conductive bump 195 is surrounded by the passivation layers 189 and 193, in accordance with some embodiments.

Still referring to FIG. 2, the bonding pad 175 may be electrically connected to one of the S/D regions 105 through the barrier layer 171 and the interconnect structure including the conductive via 165, the conductive via 141', the conductive structure 135 and the conductive via 125. Referring to FIGS. 1 and 2, the bonding pad 175 may be electrically connected to external devices through the anti-reflective coating layer 177, the conductive bump 195 and other wire bonding components.

It should be noted that, due to the presence of spacers (e.g., the second spacers 181' and/or the third spacers 185') over the sidewalls 175S of the bonding pad 175, short circuiting between the bonding pad 175 and adjacent bonding pads caused by misalignment of the bonding pad 175 and the conductive bump 195 may be prevented. As a result, the overall device performance may be improved, and the yield rate of the semiconductor device 100a may be increased. Moreover, since the dielectric layers 133, 153 and 163 and the passivation layer 193 may include silicon-rich oxide (SRO), the semiconductor device 100a may be protected from being contaminated by the external moisture.

Figure 3:
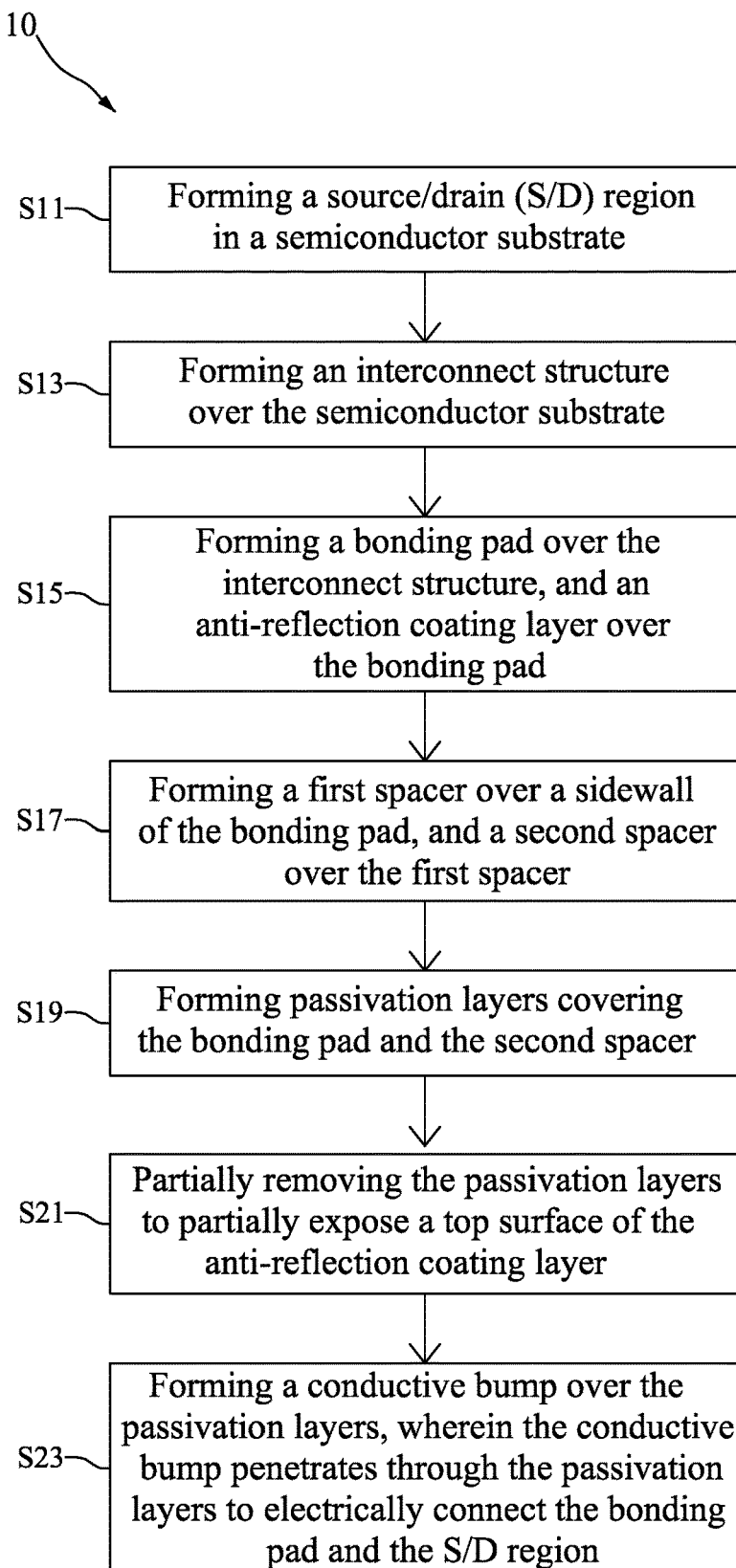
FIG. 3 is a flow diagram illustrating a method of preparing a semiconductor device, in accordance with some embodiments.

FIG. 3 is a flow diagram illustrating a method 10 of preparing a semiconductor device (e.g., the semiconductor device 100a in FIG. 2 or another semiconductor device 100b in FIG. 22), wherein the method 10 includes steps S11, S13, S15, S17, S19, S21 and S23, in accordance with some embodiments. The steps S11 to S23 of FIG. 3 are described in connection with following figures.

FIGS. 4 to 19 are cross-sectional views along the sectional line I-I' in FIG. 1 illustrating intermediate stages in the formation of the semiconductor device 100a, in accordance with some embodiments.

Figure 4:
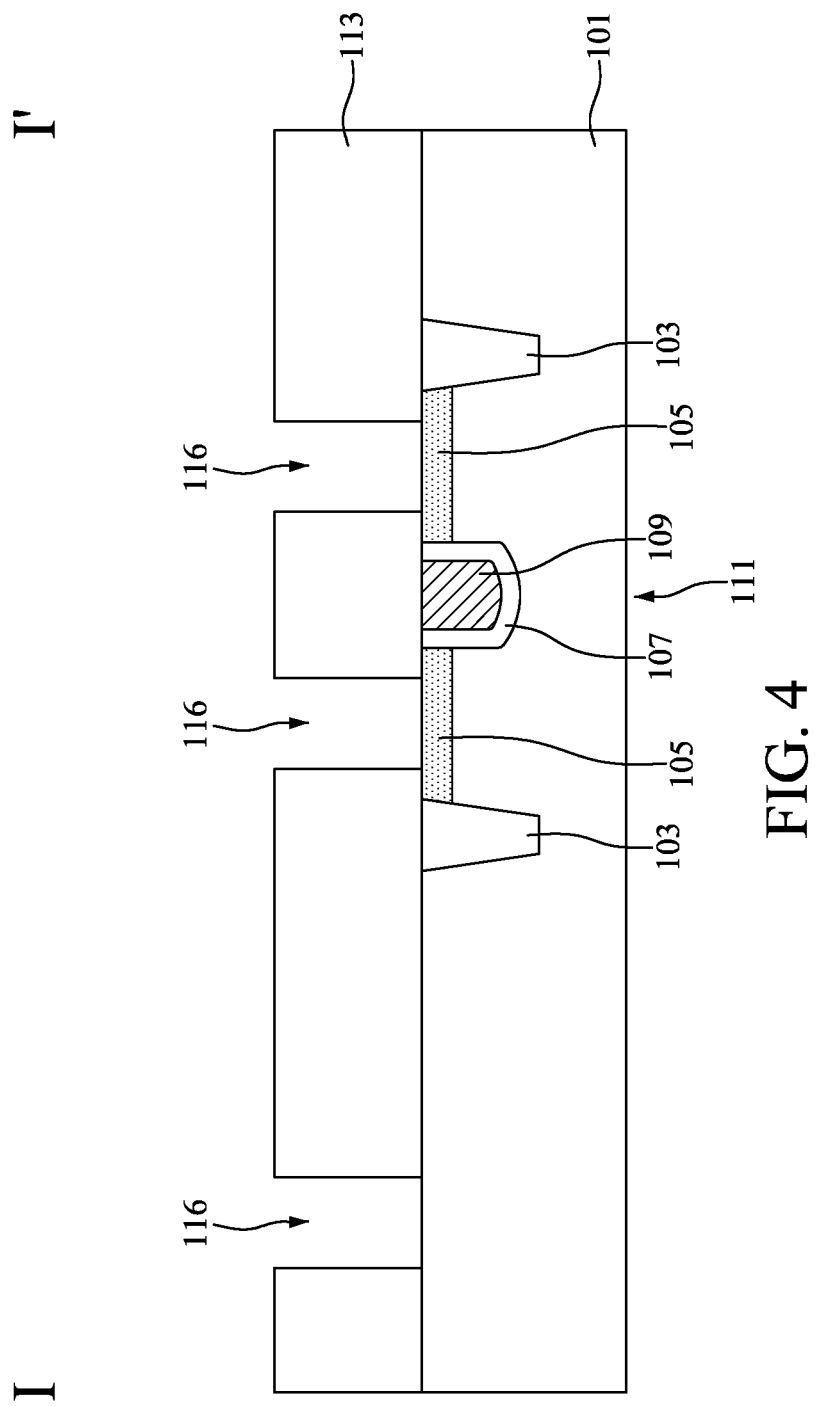
FIG. 4 is a cross-sectional view illustrating an intermediate stage in the formation of the semiconductor device along the sectional line I-I' in FIG. 1, in accordance with some embodiments.

As shown in FIG. 4, the semiconductor substrate 101 is provided. The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and diamond. Examples of the compound semiconductor materials may include, but are not limited to, silicon carbide, gallium arsenic, gallium phosphide, indium phosphide, indium arsenide, and indium antimonide. Examples of the alloy semiconductor materials may include, but are not limited to, SiGe, GaAsP, AlInAs, AlGaAs, GaInAs, GaInP, and GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

Still referring to FIG. 4, the isolation structures 103 are formed in the semiconductor substrate 101, wherein the isolation structures 103 are shallow trench isolation (STI) structures, in accordance with some embodiments. In some other embodiments, the isolation structures 103 are local oxidation of silicon (LOCOS) structures (not shown). In such cases, portions of the isolation structures 103 are embedded in the semiconductor substrate 101, and other portions of the isolation structures 103 protrude from the top surface of the semiconductor substrate 101. In addition, the isolation structures 103 may be made of silicon oxide, silicon nitride, silicon oxynitride or another applicable dielectric material.

Moreover, the isolation structures 103 define the active region in the semiconductor substrate 101, and the active region includes the S/D regions 105. In some embodiments, the S/D regions 105 are formed by one or more ion implantation processes, and P-type dopants, such as boron (B) or $BF_2$, or N-type dopants, such as phosphorous (P) or arsenic (As), can be implanted in the active region to form the S/D regions 105. The respective step is illustrated as the step S11 in the method 10 shown in FIG. 3.

Next, the gate structure 111 including the gate electrode 109 and the gate dielectric layer 107 is formed in the semiconductor substrate 101. In some embodiments, the gate electrode 109 is made of a conductive material such as aluminum (Al), copper (Cu), tungsten (W), titanium (Ti), tantalum (Ta), or another applicable material, and the gate dielectric layer 107 is made of silicon oxide, silicon nitride, silicon oxynitride, a dielectric material with high dielectric constant (high-k), or a combination thereof.

In some embodiments, the gate structure 111 is formed by etching and deposition processes. First, a trench is formed in the semiconductor substrate 101 by an etching process. The etching process may include a dry etching process, a wet etching process, or a combination thereof. After the trench is formed, deposition processes may be performed to form the gate structure 111 in the trench, wherein the deposition processes may include a chemical vapor deposition (CVD) process, a physical vapor deposition (PVD) process, a spin-coating process, or another applicable process. After performing the deposition processes, a planarization process, such as chemical mechanical polishing (CMP), may be performed such that the top surface of the gate structure 111 is coplanar with the top surface of the semiconductor substrate 101.

A transistor including the S/D regions 105 and the gate structure 111 is formed in the semiconductor substrate 101, in accordance with some embodiments. Next, a dielectric layer 113 is formed over the semiconductor substrate 101, and openings 116 are formed, wherein the openings 116 penetrate through the dielectric layer 113, as shown in FIG. 4 in accordance with some embodiments. It should be noted that the S/D regions 105 are exposed through the openings 116.

In some embodiments, the dielectric layer 113 is made of silicon oxide, silicon nitride, silicon oxynitride, phosphosilicate glass (PSG), borophosphosilicate glass (BPSG), low-k dielectric material, and/or other applicable dielectric materials. Examples of the low-k dielectric materials include, but are not limited to, fluorinated silica glass (FSG), carbon doped silicon oxide, amorphous fluorinated carbon, parylene, bis-benzocyclobutenes (BCB), or polyimide. In addition, the dielectric layer 113 may be formed by CVD, PVD, atomic layer deposition (ALD), spin coating, or another applicable process. In some embodiments, the openings 116 are formed by an etching process, using a patterned layer as a mask, wherein the etching process includes a dry etching process, a wet etching process, or a combination thereof.

Figure 5:
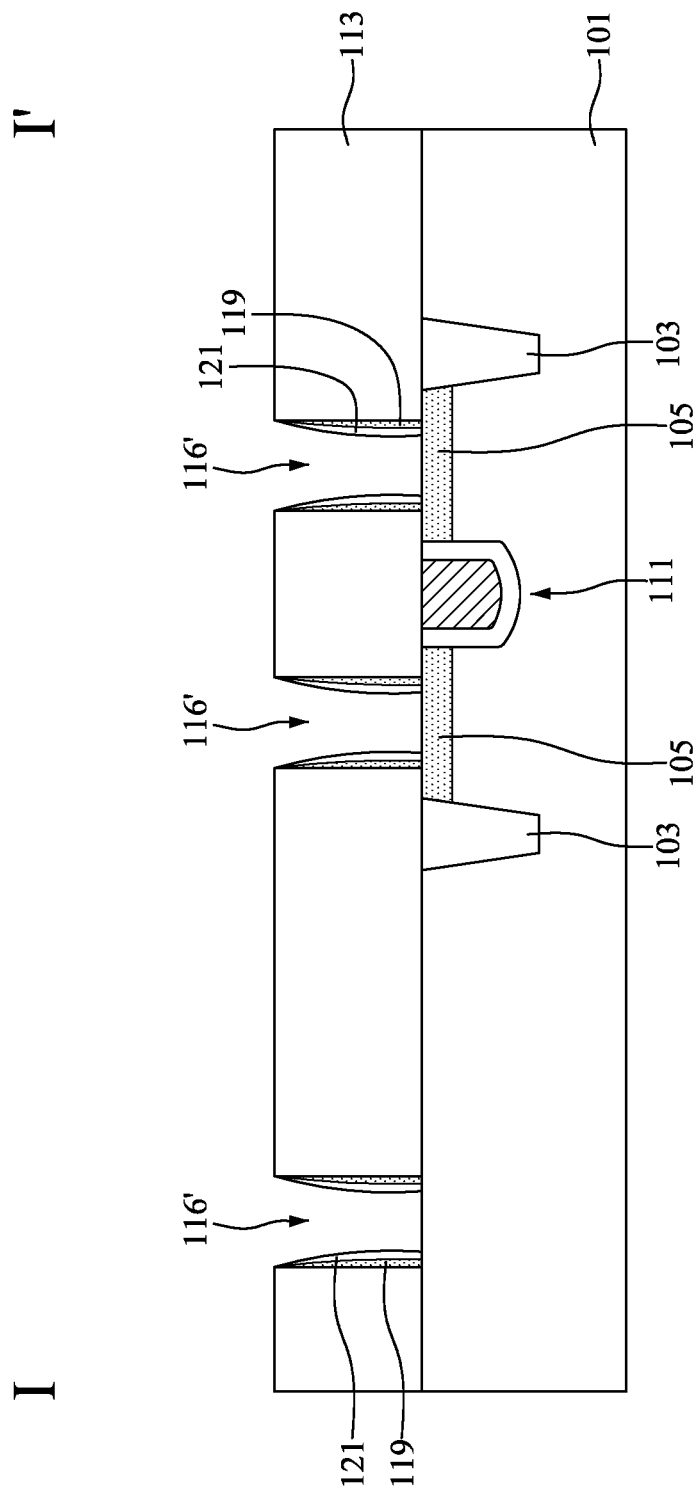
FIG. 5 is a cross-sectional view illustrating an intermediate stage in the formation of the semiconductor device along the sectional line I-I' in FIG. 1, in accordance with some embodiments.

Next, first inner spacers 119 are formed, wherein the inner spacers 119 line the sidewalls of the openings 116, and second inner spacers 121 are formed, wherein the second inner spacers 121 line the sidewalls of the first inner spacers 119, as shown in FIG. 5 in accordance with some embodiments. In other words, in some embodiments, the first inner spacers 119 are between the second inner spacers 121 and the dielectric layer 113, and the S/D regions 105 and the semiconductor substrate 101 are partially exposed through remaining openings 116'.

In some embodiments, the first inner spacers 119 are made of silicon oxide, and the second inner spacers 121 are made of silicon nitride. It should be noted that the materials of the first inner spacers 119 are different from the materials of the second inner spacers 121, such that the first inner spacers 119 and the second inner spacers 121 have an etching selectivity during the subsequent etching process for forming air gaps. Moreover, the first inner spacers 119 and the second inner spacers 121 may be formed by deposition and etching processes. In some embodiments, the deposition process includes CVD, PVD, spin coating, or another applicable process, and the etching process is an anisotropic etching process. The directional nature of the anisotropic etching process removes the same vertical thickness of first and second inner spacer materials in all places, leaving the first inner spacers 119 and the second inner spacers 121 adjacent to the sidewalls of the openings 116 (see FIG. 4).

Figure 6:
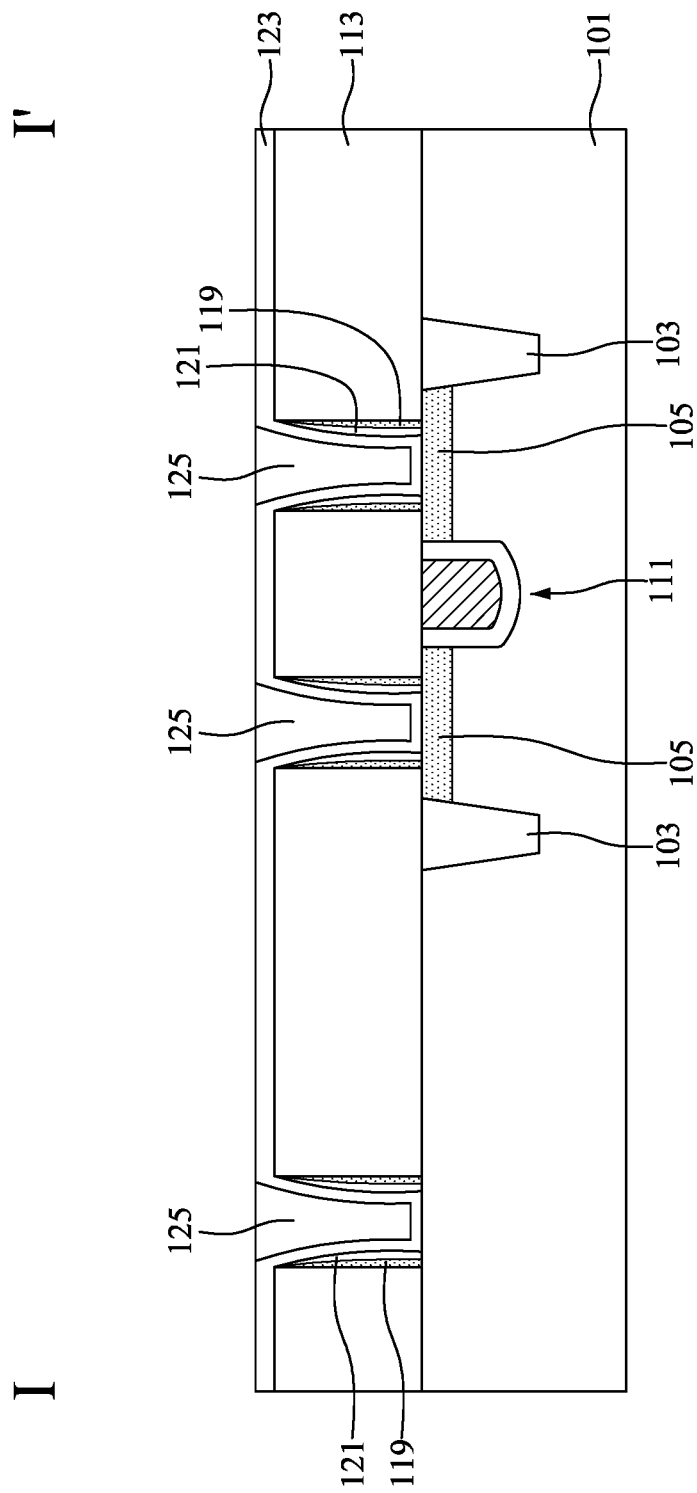
FIG. 6 is a cross-sectional view illustrating an intermediate stage in the formation of the semiconductor device along the sectional line I-I' in FIG. 1, in accordance with some embodiments.

After the first and second inner spacers 119 and 121 are formed, a barrier layer 123 is formed, wherein the barrier layer 123 lines the remaining openings 116' and extends over the dielectric layer 113, and conductive vias 125 are formed over the barrier layer 123, as shown in FIG. 6 in accordance with some embodiments. In some embodiments, the barrier layer 123 is made of tantalum (Ta), tantalum nitride (TaN), titanium (Ti), titanium nitride (TiN), cobalt tungsten (CoW) or another applicable material, and the barrier layer 123 is formed by CVD, PVD, ALD, plating or another applicable process.

In some embodiments, the conductive vias 125 are made of tungsten (W), cobalt (Co), titanium (Ti), aluminum (Al), copper (Cu), tantalum (Ta), platinum (Pt), molybdenum (Mo), silver (Ag), manganese (Mn), zirconium (Zr), ruthenium (Ru), or another applicable material. In some embodiments, the conductive vias 125 are formed by depositing a conductive material over the barrier layer 123, wherein the deposition of the conductive material includes CVD, PVD, ALD, plating, or another applicable process. After the deposition process, excess portions of the conductive material may be removed by performing a planarization process, such as CMP, to expose the underlying barrier layer 123, and the conductive vias 125 are obtained.

Figure 7:
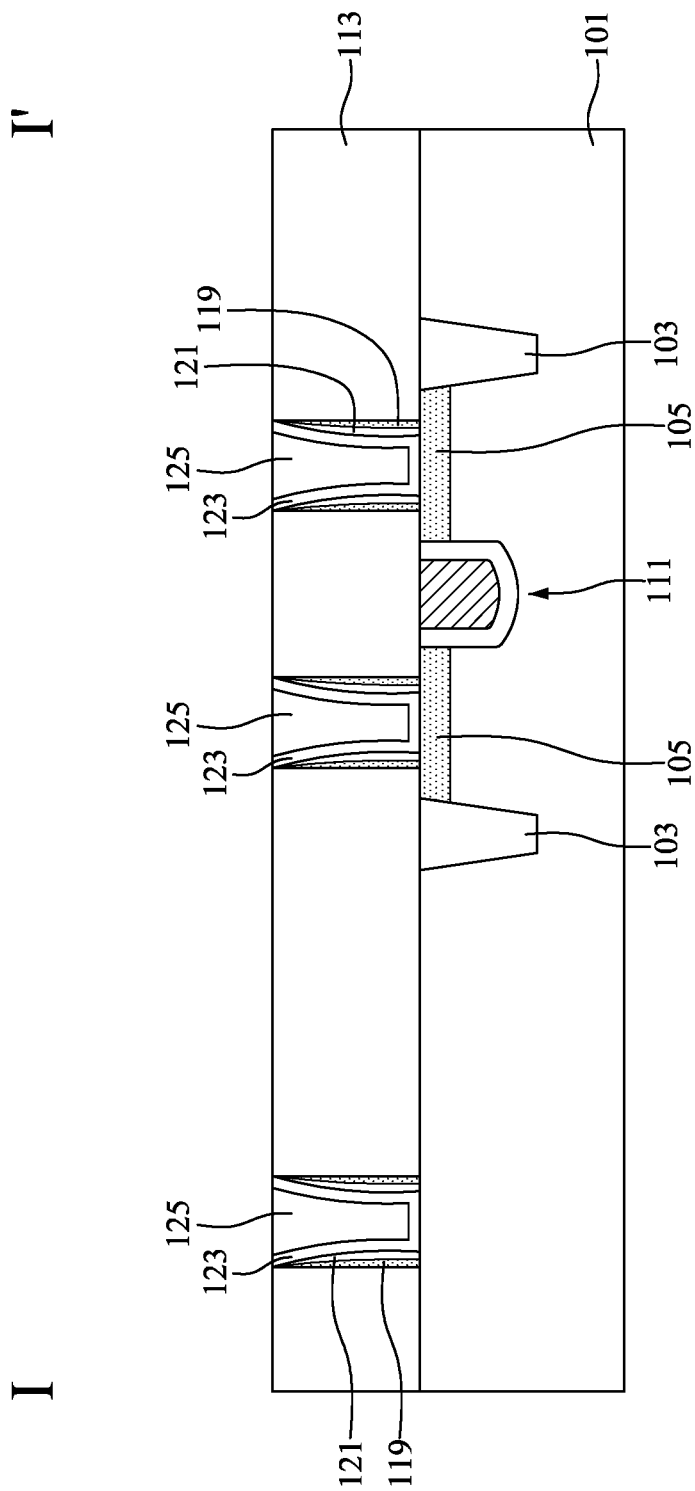
FIG. 7 is a cross-sectional view illustrating an intermediate stage in the formation of the semiconductor device along the sectional line I-I' in FIG. 1, in accordance with some embodiments.

In some embodiments, the abovementioned planarization process is performed until the dielectric layer 113 is exposed, as shown in FIG. 7. Alternatively, another planarization process, such as CMP, is performed to expose the dielectric layer 113, as shown in FIG. 7 in accordance with some embodiments. It should be noted that, in some embodiments, the first inner spacers 119 and the second inner spacers 121 are exposed after the planarization process.

Figure 8:
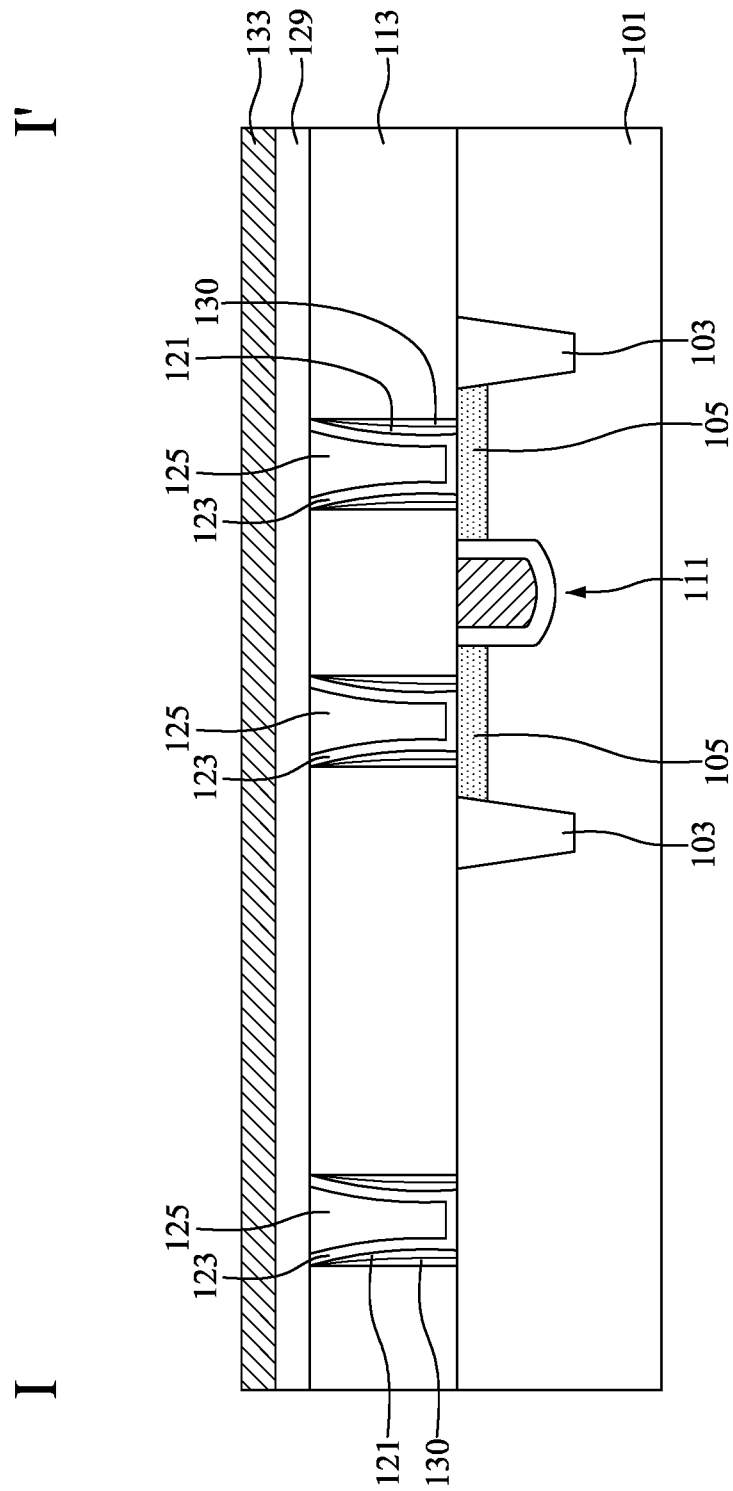
FIG. 8 is a cross-sectional view illustrating an intermediate stage in the formation of the semiconductor device along the sectional line I-I' in FIG. 1, in accordance with some embodiments.

After the first inner spacers 119 are exposed, a vapor phase hydrofluoric acid (VHF) etching process is performed to remove the first inner spacers 119, and the dielectric layers 129 and 133 are sequentially formed over the dielectric layer 113, wherein the dielectric layer 129 covers the gaps formed by the removal of the first inner spacers 119 to form sealed air gaps 130, as shown in FIG. 8 in accordance with some embodiments.

During the etching process, VHF is used as an etchant, and the first inner spacers 119 have a high etching selectivity against the second inner spacers 121 and the dielectric layer 113. Therefore, the first inner spacers 119 are removed by the etching process, while the second inner spacers 121 and the dielectric layer 113 may be substantially left, such that gaps are formed between the second inner spacers 121 and the dielectric layer 113. After the dielectric layer 129 is formed, the gaps are sealed to become air gaps 130, in accordance with some embodiments.

Some materials and processes used to form the dielectric layer 129 and 133 are similar to, or the same as, those used to form the dielectric layer 113, and similar descriptions are not repeated herein. It should be noted that the silicon content of the dielectric layer 133 is greater than the silicon content of the dielectric layer 129. For example, the dielectric layer 133 is made of silicon-rich oxide (SRO), which has a low moisture absorption rate, in accordance with some embodiments as described above.

Figure 9:
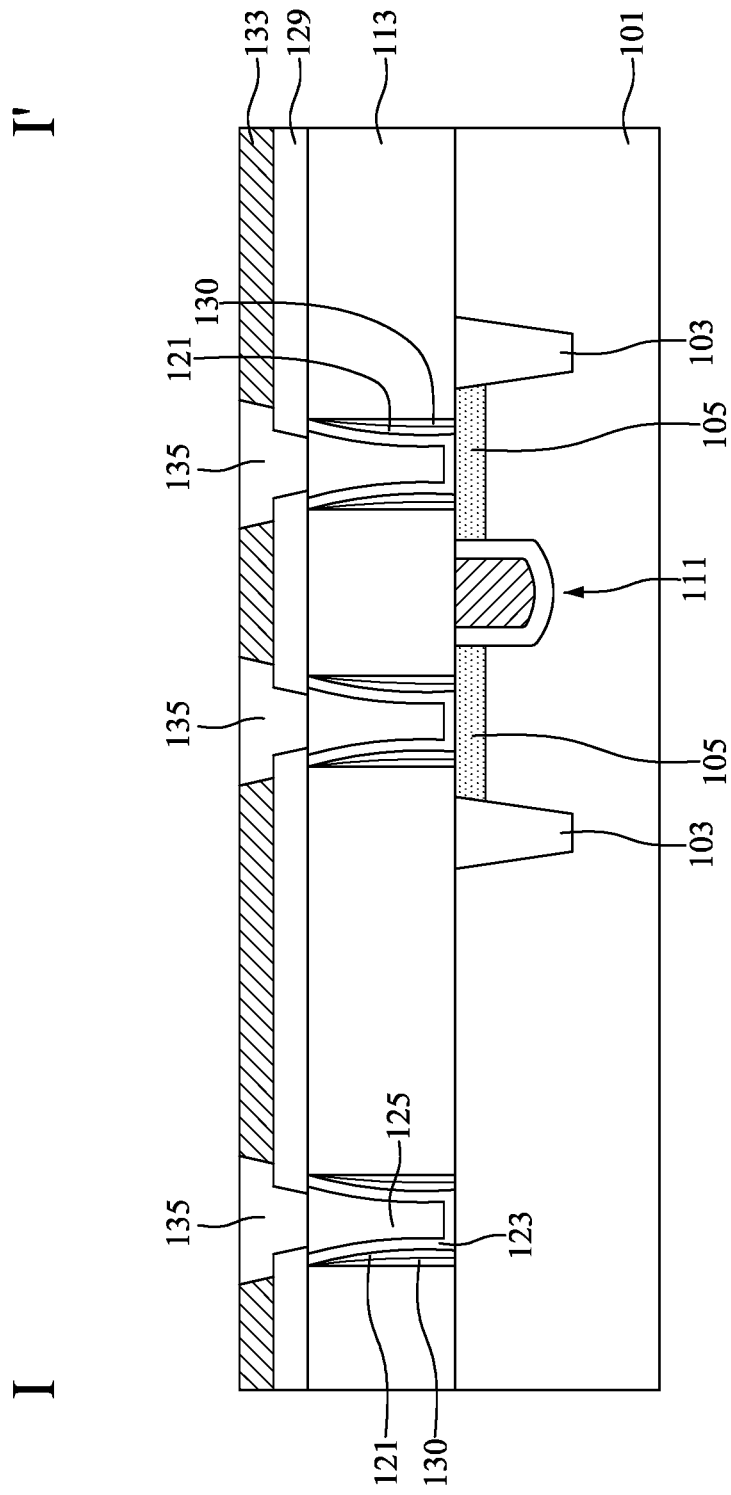
FIG. 9 is a cross-sectional view illustrating an intermediate stage in the formation of the semiconductor device along the sectional line I-I' in FIG. 1, in accordance with some embodiments.

Next, conductive structures 135 are formed in the dielectric layers 129 and 133, as shown in FIG. 9 in accordance with some embodiments. In some embodiments, the conductive structures 135 are formed by a dual damascene process. Moreover, the materials used to form the conductive structures 135 may be similar to, or the same as, those used to form the conductive vias 125, and similar descriptions are not repeated herein. In some embodiments, each of the conductive structures 135 includes multi-layers.

Figure 10:
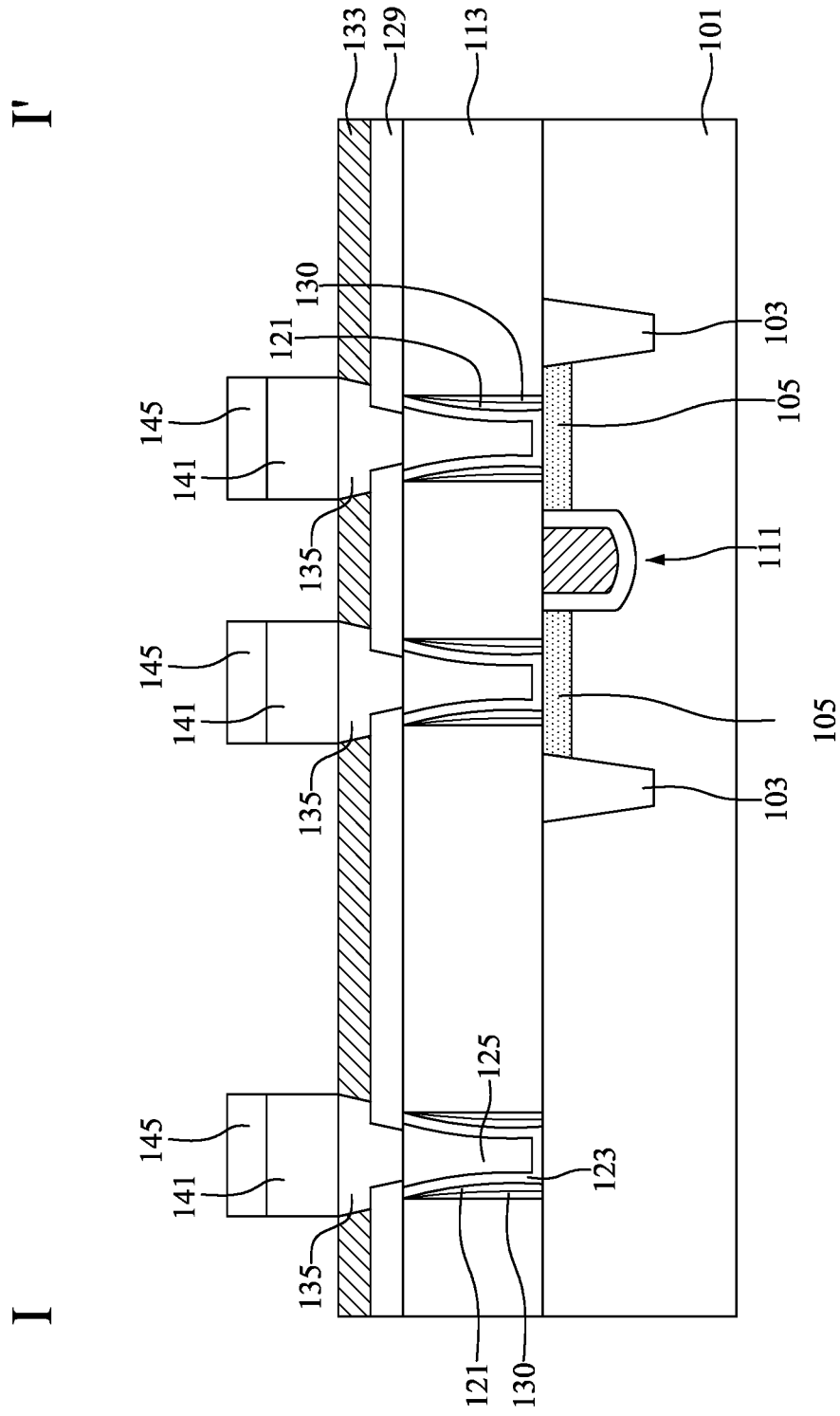
FIG. 10 is a cross-sectional view illustrating an intermediate stage in the formation of the semiconductor device along the sectional line I-I' in FIG. 1, in accordance with some embodiments.

A plurality of conductive portions 141 are formed over the conductive structures 135, and dielectric portions 145 are formed over the conductive portions 141, as shown in FIG. 10 in accordance with some embodiments. In some embodiments, the conductive portions 141 are made of polycrystalline silicon (polysilicon), tungsten (W), aluminum (Al), copper (Cu), another conductive material, or a combination thereof, and the dielectric portions 145 are made of silicon oxide ($SiO_2$), silicon nitride (SiN), silicon carbide (SiC), silicon oxynitride (SiON), silicon oxycarbide (SiOC), silicon carbonitride (SiCN), silicon oxide carbonitride (SiOCN), another applicable dielectric material, or a combination thereof.

In addition, the conductive portions 141 and the dielectric portions 145 may be formed by deposition and etching processes. The deposition processes may be CVD, PVD, ALD, spin coating, sputtering, other applicable processes, or a combination thereof. The etching processes may be performed using a patterned layer as a mask. In some embodiments, the sidewalls of the conductive portions 141 are aligned with the sidewalls of the dielectric portions 145.

Figure 11:
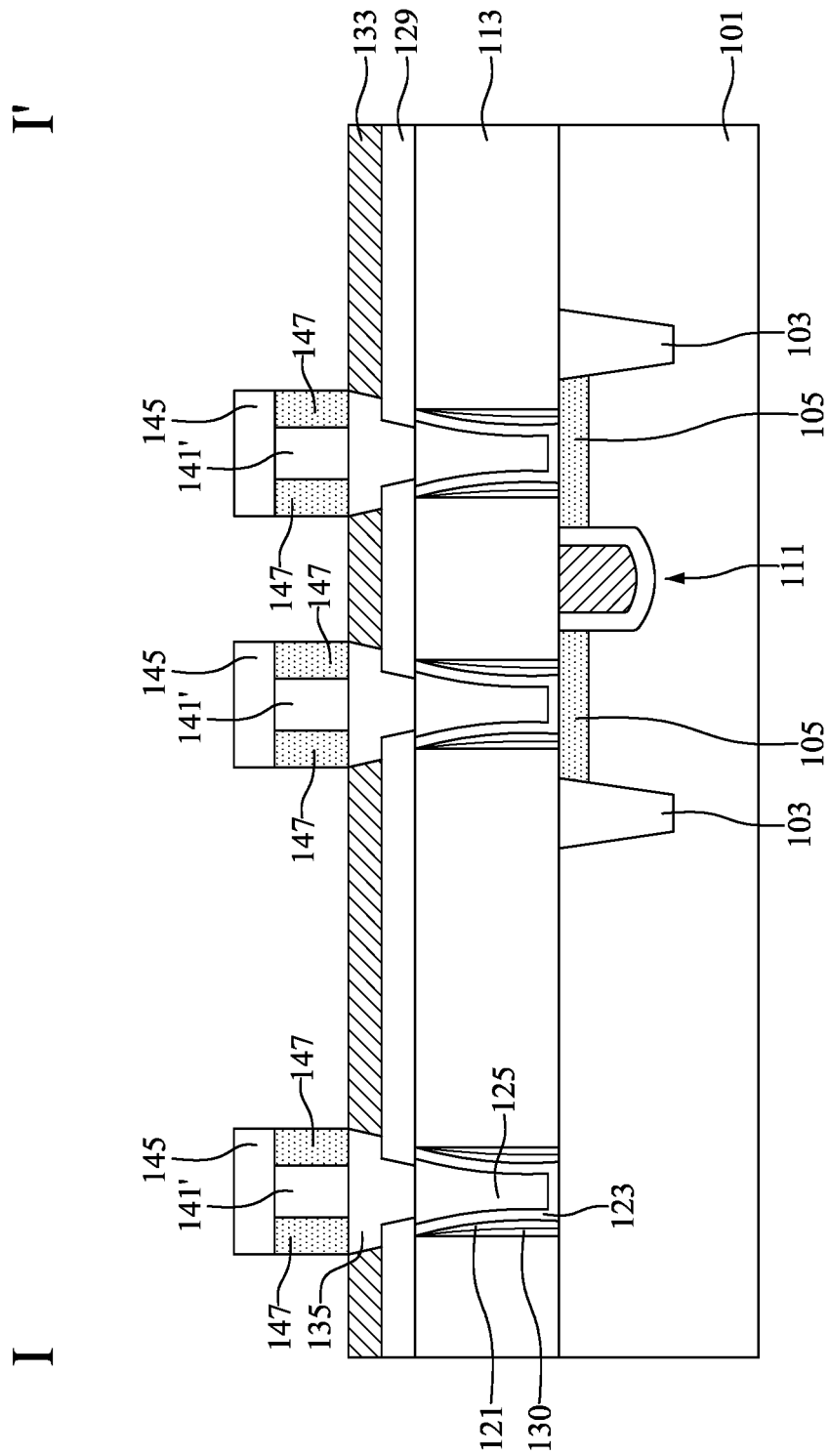
FIG. 11 is a cross-sectional view illustrating an intermediate stage in the formation of the semiconductor device along the sectional line I-I' in FIG. 1, in accordance with some embodiments.

After the dielectric portions 145 are formed, the sidewall portions of the conductive portions 141 are transformed into dielectric portions 147, as shown in FIG. 11 in accordance with some embodiments. As a result, the dielectric portions 147 are formed over opposite sidewalls of the remaining portions of the conductive portions 141, which are referred to as conductive vias 141', in accordance with some embodiments.

In some embodiments, the dielectric portions 147 are formed by performing a heat treatment process, which includes an oxidation process, a nitridation process, another applicable process or a combination thereof. In order to reach a high etching selectivity during the subsequent etching process, the materials of the dielectric portions 147 should be different from the materials of the dielectric portions 145. Therefore, the gas applied during the heat treatment process is selected based on the materials of the dielectric portions 145.

For example, if the dielectric portions 145 are made of silicon oxide, nitrogen may be diffused into the sidewall surfaces of the conductive portions 141 during the heat treatment process (i.e., nitridation process), and the dielectric portions 147 may be made of nitride, such as silicon nitride.

In addition, if the dielectric portions 145 are made of silicon nitride, oxygen may be diffused into the sidewall surfaces of the conductive portions 141 during the heat treatment process (i.e., oxidation process), and the dielectric portions 147 may be made of silicon oxide ($SiO_2$), tungsten oxide (WO), aluminum oxide ($Al_2O_3$), copper oxide (CuO), or a combination thereof, depending on the materials of the conductive portions 141.

Figure 12:
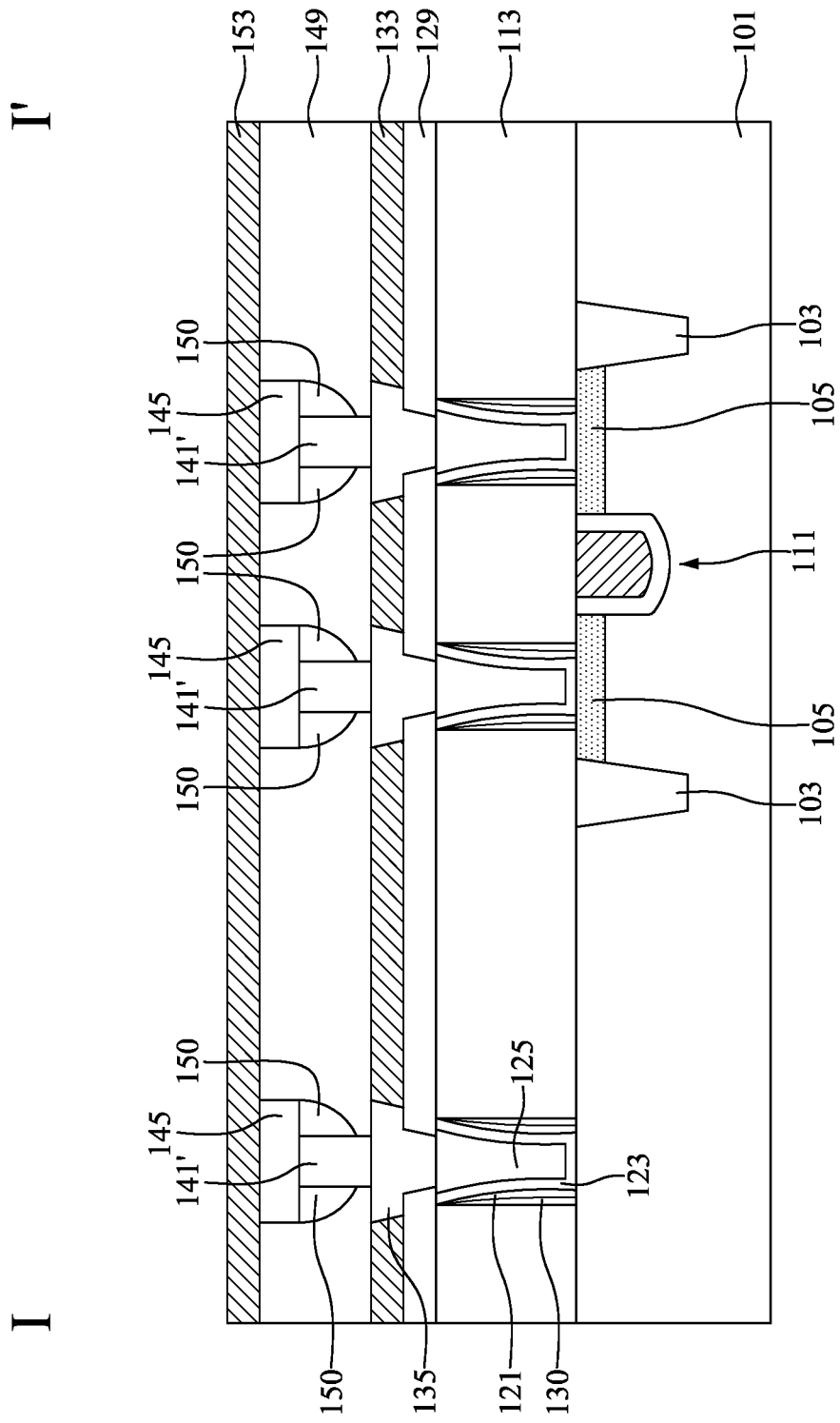
FIG. 12 is a cross-sectional view illustrating an intermediate stage in the formation of the semiconductor device along the sectional line I-I' in FIG. 1, in accordance with some embodiments.

After the conductive vias 141' are obtained, the dielectric portions 147 are removed by an etching process, the dielectric layer 149 is formed over sidewalls of the dielectric portions 145, and the dielectric layer 153 is formed over the dielectric layer 149, as shown in FIG. 12 in accordance with some embodiments. The etching process for the removal of the dielectric portions 147 may include dry etching (e.g., RIE), wet etching and/or other etching methods. Moreover, since the sidewalls of the conductive vias 141' are separated from the sidewalls of the dielectric portions 145, the dielectric layer 149 is formed with air gaps 150 enclosed between the dielectric portions 145, the conductive vias 141' and the dielectric layer 149.

Some materials and processes used to form the dielectric layers 149 and 153 are similar to, or the same as, those used to form the dielectric layers 129 and 133, and similar descriptions are not repeated herein. It should be noted that the silicon content of the dielectric layer 153 is greater than the silicon content of the dielectric layer 149. For example, the dielectric layer 153 is made of silicon-rich oxide (SRO), which has a low moisture absorption rate, in accordance with some embodiments as described above.

Figure 13:
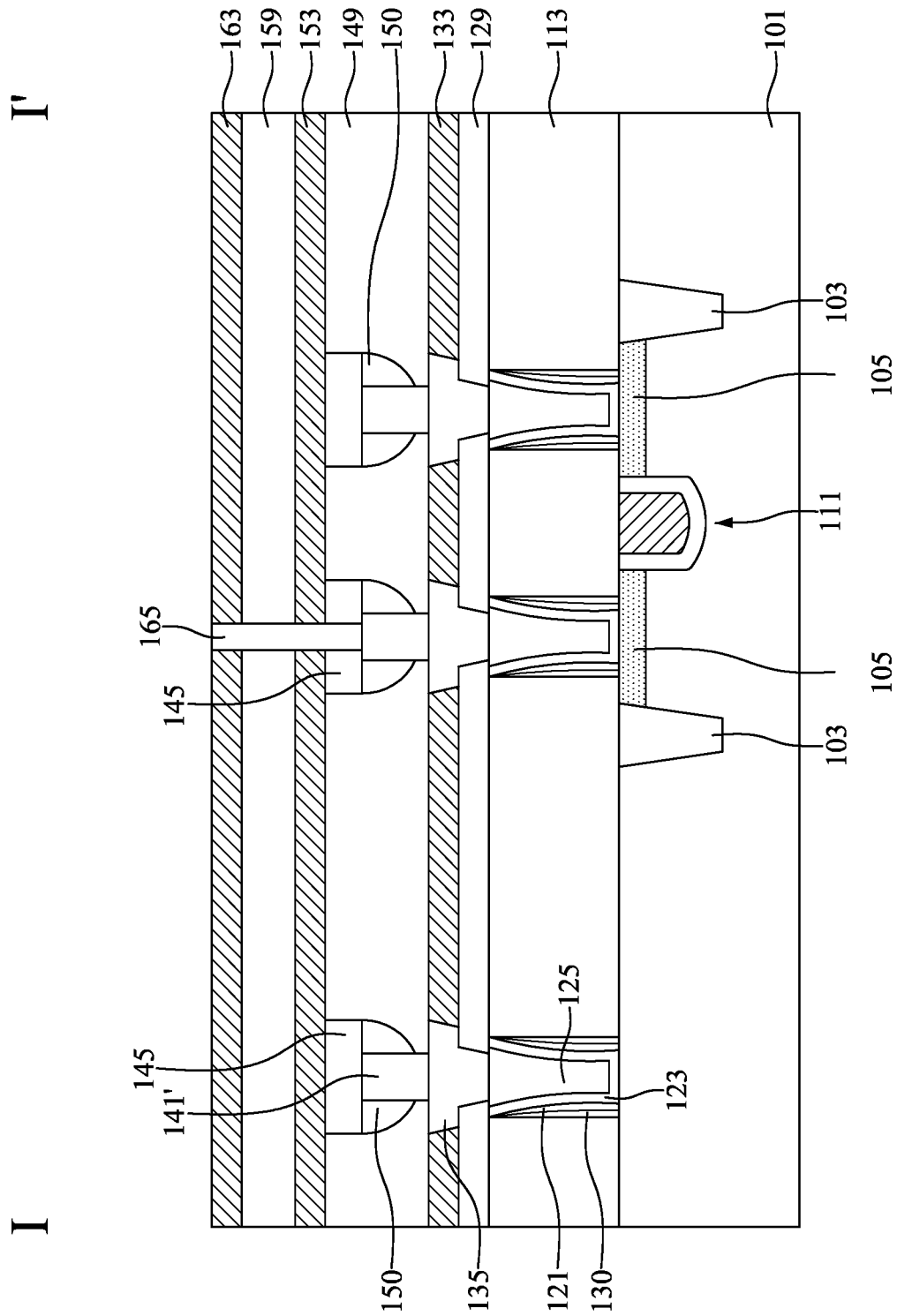
FIG. 13 is a cross-sectional view illustrating an intermediate stage in the formation of the semiconductor device along the sectional line I-I' in FIG. 1, in accordance with some embodiments.

Next, the dielectric layers 159 and 163 are sequentially formed over the dielectric layer 153, and the conductive via 165 is formed, wherein the conductive via 165 penetrates through the dielectric layers 163, 159 and 153 and the dielectric portion 145, as shown in FIG. 13 in accordance with some embodiments. Some materials and processes used to form the dielectric layers 159 and 163 are similar to, or the same as, those used to form the dielectric layers 129 and 133, and similar descriptions are not repeated herein. It should be noted that the silicon content of the dielectric layer 163 is greater than the silicon content of the dielectric layer 159. For example, the dielectric layer 163 is made of silicon-rich oxide (SRO), which has a low moisture absorption rate, in accordance with some embodiments as described above.

After the dielectric layers 159 and 163 are formed, the conductive via 165 is formed by an etching process and a subsequent deposition process. The etching process may be performed using a patterned layer as a mask to form an opening in the dielectric layers 163, 159 and 153 and the dielectric portion 145, and the etching process may include a dry etching process, a wet etching process, or a combination thereof. Next, the deposition process including CVD, PVD, spin coating, or another applicable process may be performed to deposit one or more conductive materials in the opening and above the dielectric layer 163. Subsequently, the excess portions of the conductive material(s) may be removed by performing a planarization process (e.g., CMP) to expose the dielectric layer 163, such that the conductive via 165, which is electrically connected to the underlying conductive via 141', is obtained.

After the conductive via 165 is formed, the interconnect structure including the conductive via 165, the conductive vias 141', the conductive structures 135 and the conductive vias 125 is formed over the semiconductor substrate 101. The respective step is illustrated as the step S13 in the method 10 shown in FIG. 3.

Figure 14:
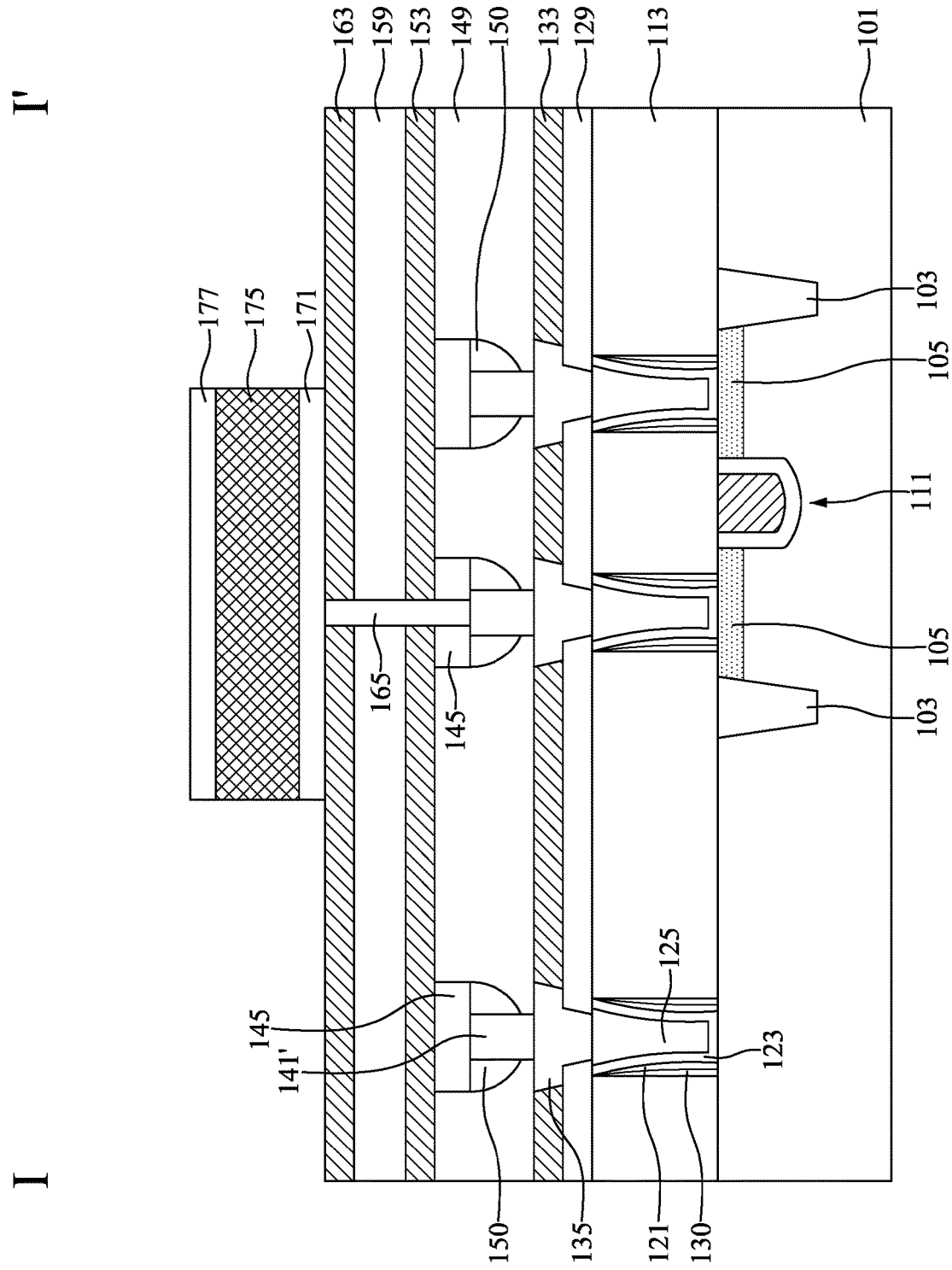
FIG. 14 is a cross-sectional view illustrating an intermediate stage in the formation of the semiconductor device along the sectional line I-I' in FIG. 1, in accordance with some embodiments.

Next, a barrier layer 171, a bonding pad 175 and an anti-reflective coating layer 177 are formed in a stacked configuration over the dielectric layer 163, as shown in FIG. 14 in accordance with some embodiments. The respective step is illustrated as the step S15 in the method 10 shown in FIG. 3. Some materials used to form the barrier layer 171 are similar to, or the same as, those used to form the barrier layer 123, and similar descriptions are not repeated herein. In some embodiments, the bonding pad 175 is made of aluminum (Al), copper (Cu), another conductive material, or a combination thereof.

Moreover, in some embodiments, the anti-reflective coating layer 177 is made of a high dielectric constant material (high-k material), such as LaO, AlO, ZrO, TiO, $Ta_2O_5$, $Y_2O_3$, $SrTiO_3$(STO), $BaTiO_3$(BTO), BaZrO, $HfO_2$, $HfO_3$, HfZrO, HfLaO, HfSiO, HfSiON, LaSiO, AlSiO, HfTaO, HfTiO, HfTaTiO, HfAlON, $(Ba,Sr)TiO_3$(BST), $Al_2O_3$, another applicable high-k dielectric material, or a combination thereof. In some embodiments, the anti-reflective coating layer 177 includes metal oxide, metal nitride, metal silicate, transition metal-oxide, transition metal-nitride, transition metal-silicate, another applicable material, or a combination thereof.

The barrier layer 171, the bonding pad 175 and the anti-reflective coating layer 177 may be formed by one or more deposition and etching processes. In some embodiments, the sidewalls of the barrier layer 171, the bonding pad 175 and the anti-reflective coating layer 177 are aligned, and the bonding pad 175 overlaps the interconnect structure and one of the S/D regions 105.

Figure 15:
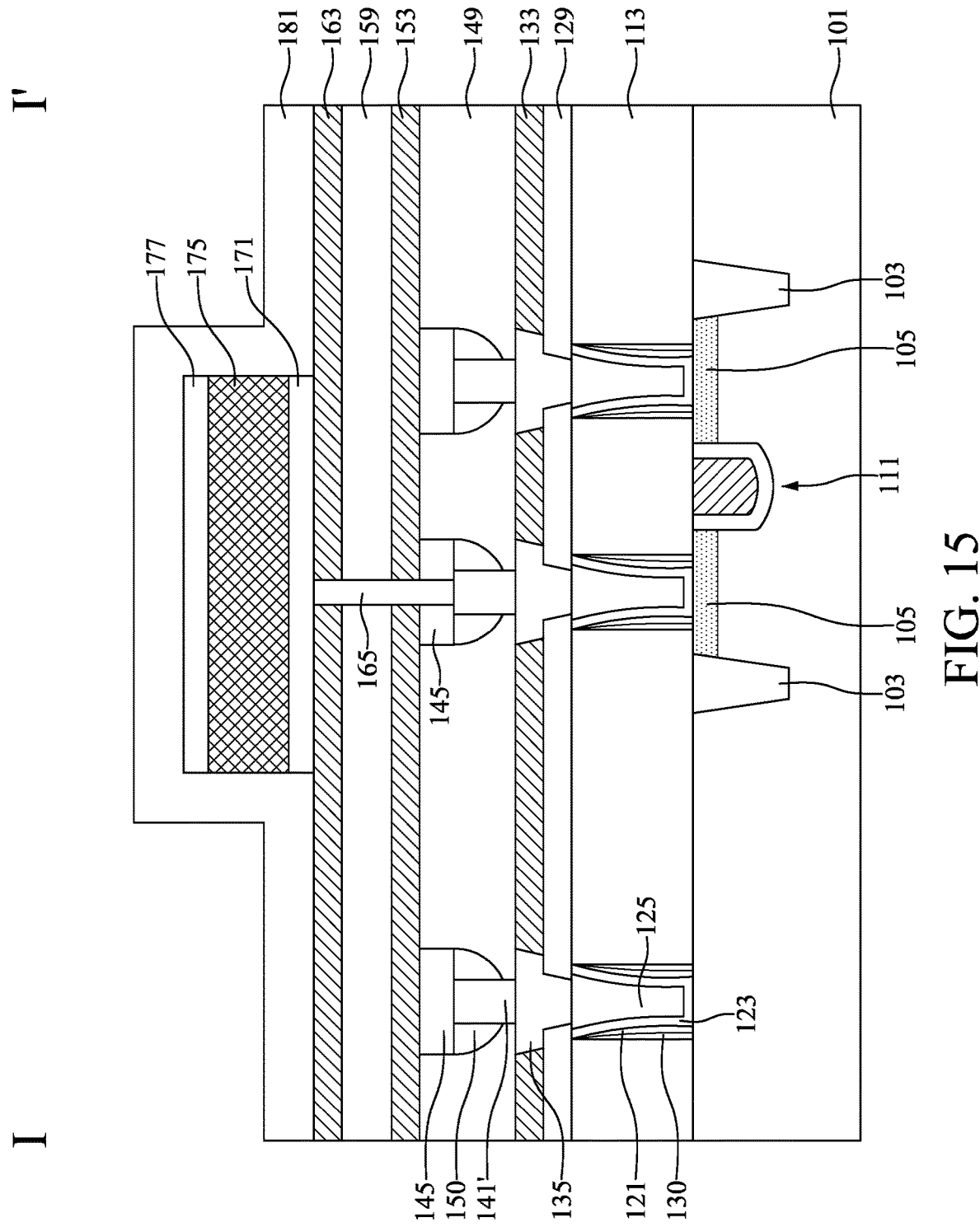
FIG. 15 is a cross-sectional view illustrating an intermediate stage in the formation of the semiconductor device along the sectional line I-I' in FIG. 1, in accordance with some embodiments.

A second spacer layer 181 is formed so as to conformally cover the dielectric layer 163 and the anti-reflective coating layer 177, as shown in FIG. 15 in accordance with some embodiments. In some embodiments, the sidewalls of the barrier layer 171, the sidewalls of the bonding pad 175, and the sidewalls of the anti-reflective coating layer 177 are covered by the second spacer layer 181. In some embodiments, the second spacer layer 181 is made of oxide, nitride, another applicable dielectric material, or a combination thereof. Moreover, the second spacer layer 181 may be formed by a deposition process, such as CVD, PVD, spin coating, or another applicable process.

Figure 16:
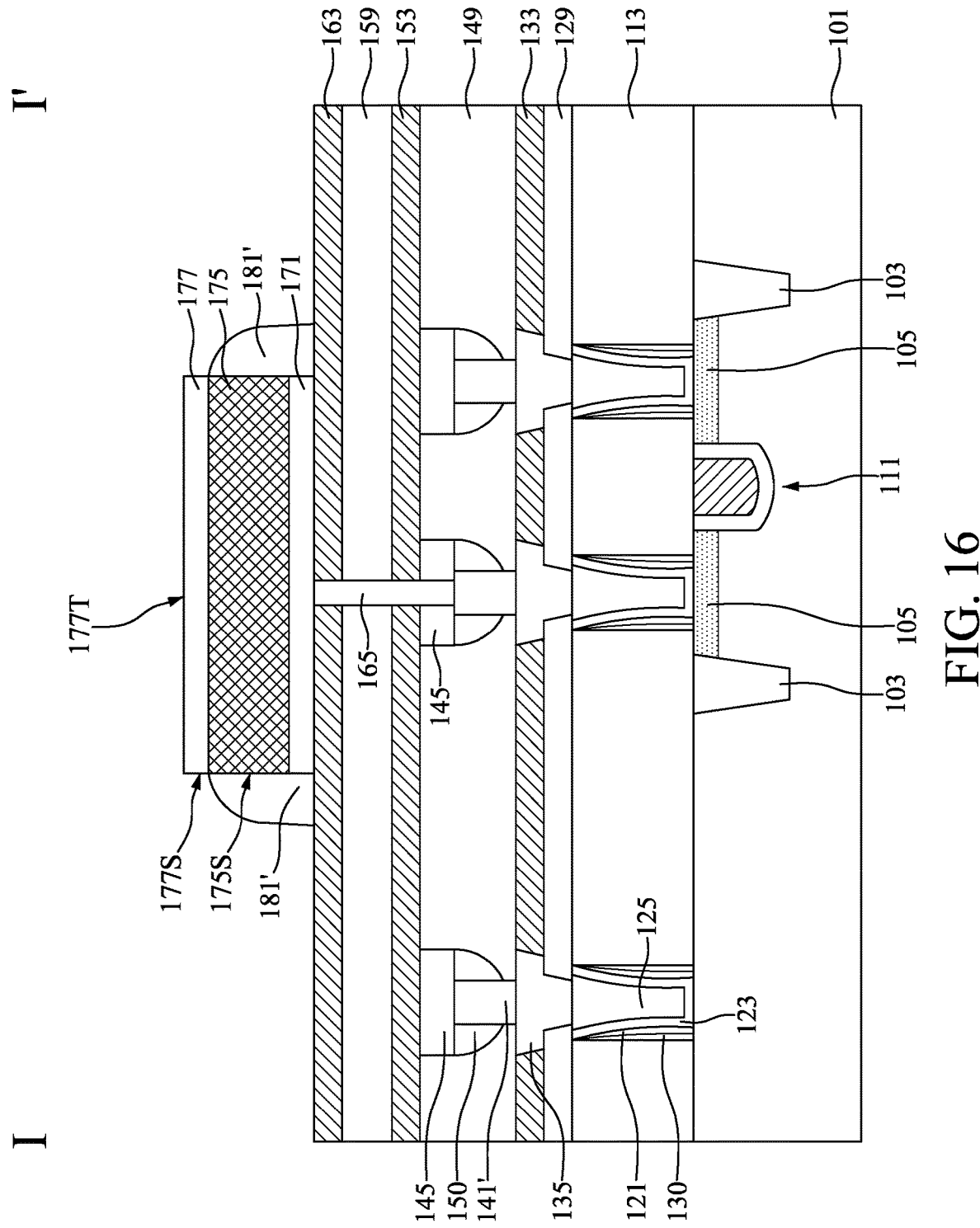
FIG. 16 is a cross-sectional view illustrating an intermediate stage in the formation of the semiconductor device along the sectional line I-I' in FIG. 1, in accordance with some embodiments.

Next, the second spacer layer 181 is etched to form second spacers 181' over sidewalls 175S of the bonding pad 175, as shown in FIG. 16 in accordance with some embodiments. The respective step is illustrated as the step S17 in the method 10 shown in FIG. 3. In some embodiments, the etching process is an anisotropic etching process, which removes the same vertical thickness of the second spacer layer 181 in all places, leaving second spacers 181' over the sidewalls 175S of the bonding pad 175 and the sidewalls of the barrier layer 171. Moreover, a top surface 177T of the anti-reflective coating layer 177 is exposed.

It should be noted that, in some embodiments, the sidewalls 177S of the anti-reflective coating layer 177 are not covered by the second spacers 181'. In other words, the top surface 177T of the anti-reflective coating layer 177 is higher than top surfaces of the second spacers 181', in accordance with some embodiments.

Figure 17:
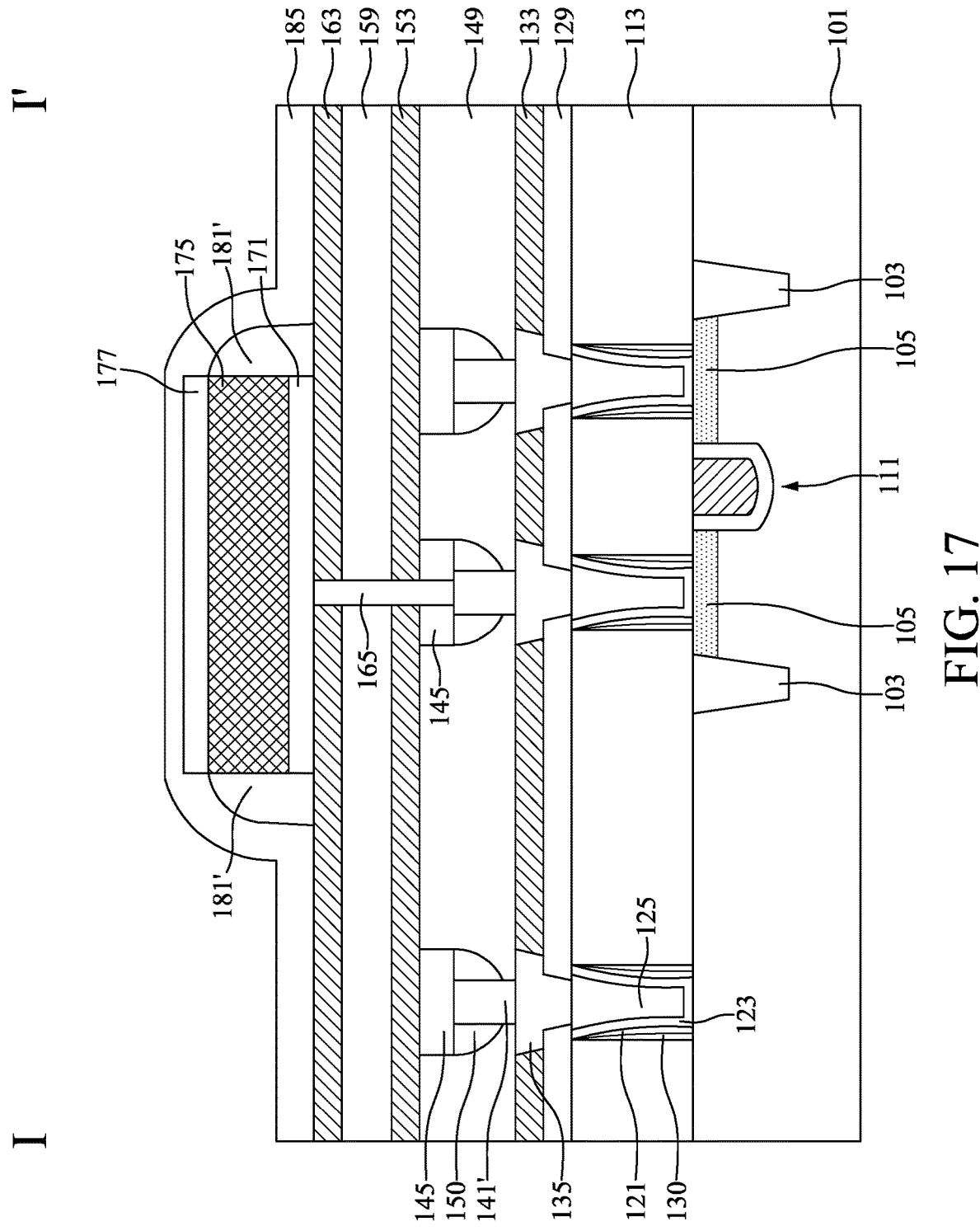
FIG. 17 is a cross-sectional view illustrating an intermediate stage in the formation of the semiconductor device along the sectional line I-I' in FIG. 1, in accordance with some embodiments.

After the second spacers 181' are formed, a third spacer layer 185 is formed so as to conformally cover the dielectric layer 163, the second spacers 181' and the anti-reflective coating layer 177, as shown in FIG. 17 in accordance with some embodiments. In some embodiments, the sidewalls 177S (see FIG. 16) of the anti-reflective coating layer 177 exposed through the second spacers 181' are covered by the third spacer layer 185.

Some materials and processes used to form the third spacer layer 185 are similar to, or the same as, those used to form the second spacer layer 181, and similar descriptions are not repeated herein. It should be noted that the materials of the second spacer layer 181 and the third spacer layer 185 are different. For example, in some embodiments, the second spacer layer 181 is made of oxide, and the third spacer layer 185 is made of nitride. In some other embodiments, the second spacer layer 181 is made of nitride, and the third spacer layer 185 is made of oxide.

Figure 18:
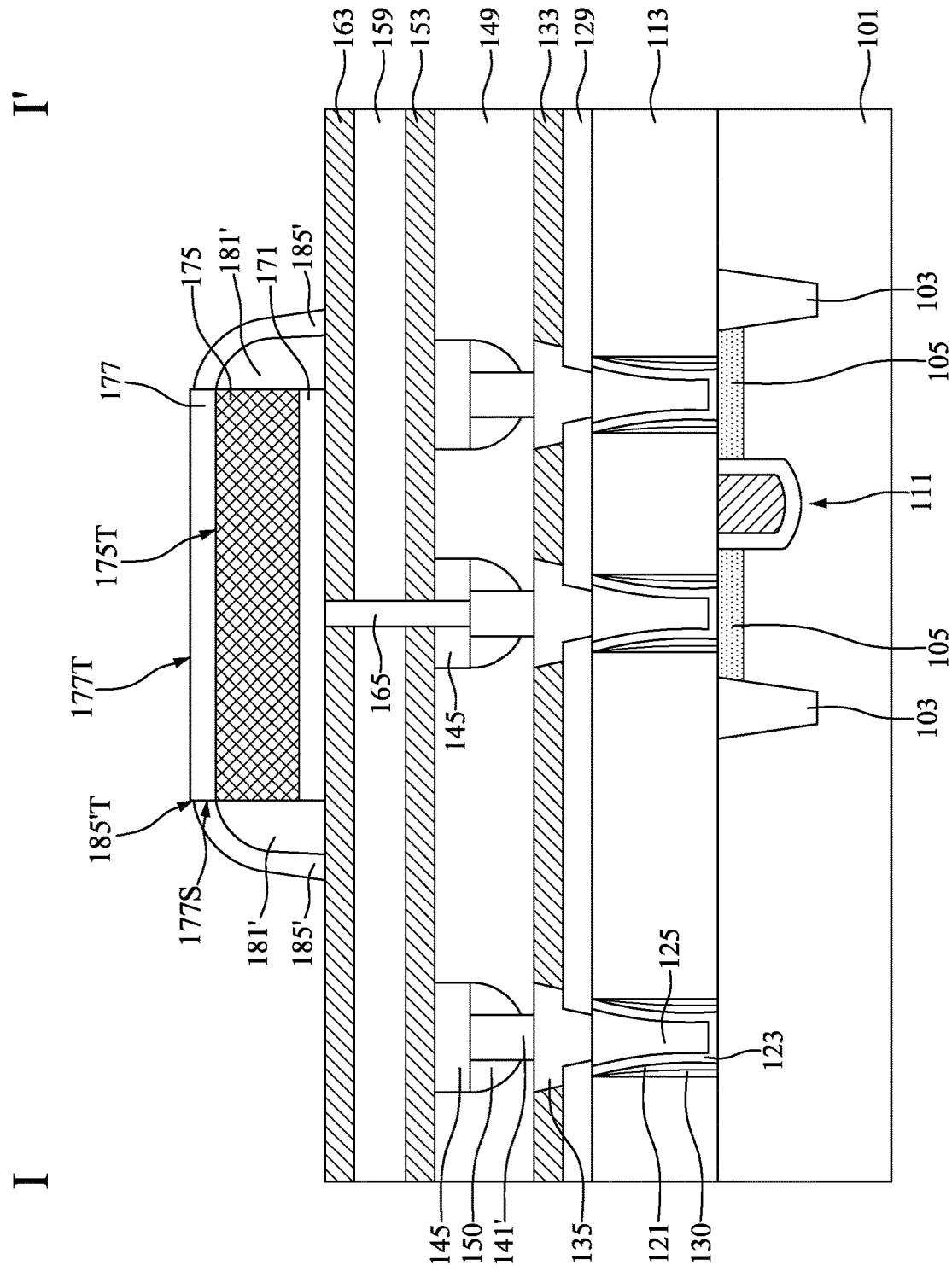
FIG. 18 is a cross-sectional view illustrating an intermediate stage in the formation of the semiconductor device along the sectional line I-I' in FIG. 1, in accordance with some embodiments.

Similar to the formation of the second spacers 181', the third spacer layer 185 is etched to form third spacers 185' over the second spacers 181', as shown in FIG. 18 in accordance with some embodiments. The respective step is illustrated as the step S17 in the method 10 shown in FIG. 3. In some embodiments, the second spacers 181' and the third spacers 185' are in direct contact with the dielectric layer 163.

In some embodiments, the etching process is an anisotropic etching process, which removes the same vertical thickness of the third spacer layer 185 in all places, leaving the third spacers 185' over the sidewalls 177S of the anti-reflective coating layer 177 and the sidewalls of the second spacers 181'. Moreover, top surfaces 185'T (i.e., the topmost surfaces) of the third spacers 185' are higher than the top surface 175T of the bonding pad 175, in accordance with some embodiments. In some embodiments, the top surface 177T of the anti-reflective coating layer 177 is exposed after the third spacers 185' are formed.

Figure 19:
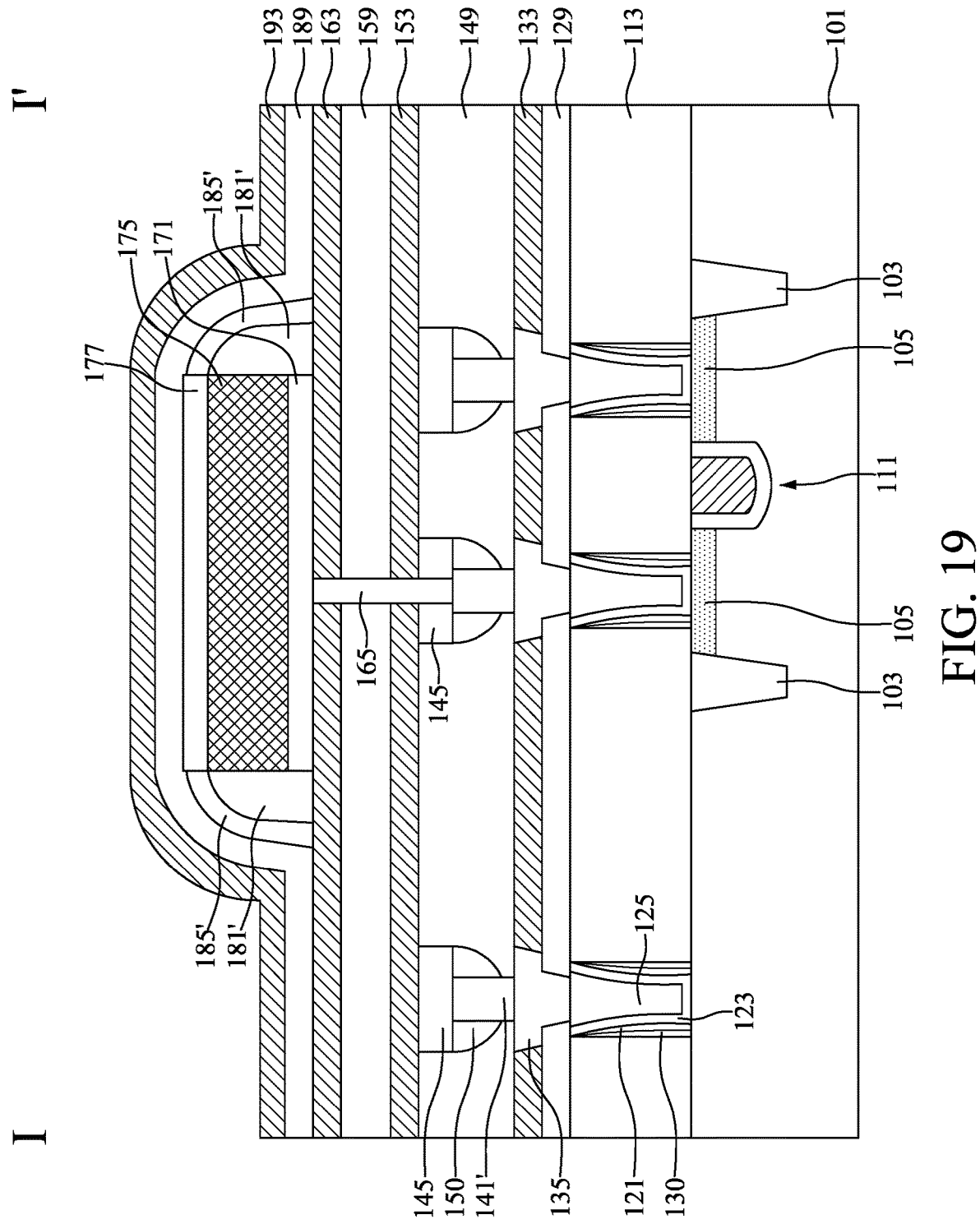
FIG. 19 is a cross-sectional view illustrating an intermediate stage in the formation of the semiconductor device along the sectional line I-I' in FIG. 1, in accordance with some embodiments.

After the third spacers 185' are formed, the passivation layers 189 and 193 are formed so as to conformally cover the dielectric layer 163, the third spacers 185' and the anti-reflective coating layer 177, as shown in FIG. 19 in accordance with some embodiments. The respective step is illustrated as the step S19 in the method 10 shown in FIG. 3.

Some materials and processes used to form the passivation layers 189 and 193 are similar to, or the same as, those used to form the dielectric layers 129 and 133, and similar descriptions are not repeated herein. It should be noted that the silicon content of the passivation layer 193 is greater than the silicon content of the passivation layer 189. For example, the passivation layer 193 is made of silicon-rich oxide (SRO), which has a low moisture absorption rate, in accordance with some embodiments as described above.

The passivation layers 189 and 193 are partially removed to partially expose the top surface 177T of the anti-reflective coating layer 177, and the conductive bump 195 is formed over the passivation layers 189 and 193, as shown in FIG. 2 in accordance with some embodiments. The respective step is illustrated as the steps S21 and S23 in the method 10 shown in FIG. 3. In some embodiments, the passivation layers 189 and 193 are penetrated by the conductive bump 195, which is electrically connected to the underlying S/D region 105 through the bonding pad 175.

In some embodiments, the passivation layers 189 and 193 are partially removed by an etching process using a patterned layer as a mask. After the partial removal of the passivation layers 189 and 193, the top surface 177T of the anti-reflective coating layer 177 is partially exposed through an opening, and the opening is then filled by the conductive bump 195, in accordance with some embodiments. In some embodiments, the conductive bump 195 extends over the passivation layers 189 and 193, and the conductive bump 195 is formed by CVD, PVD, ALD, plating, or another applicable process.

In some embodiments, the conductive bump 195 includes solder bump, solder ball, metal pillar bump, another applicable connector, or a combination thereof. In some embodiments, the conductive bump 195 is made of copper (Cu), tin (Sn), aluminum (Al), nickel (Ni), silver (Ag), another applicable conductive material, or a combination thereof. After the conductive bump 195 is formed, the semiconductor device 100*a* is obtained.

Figure 20:
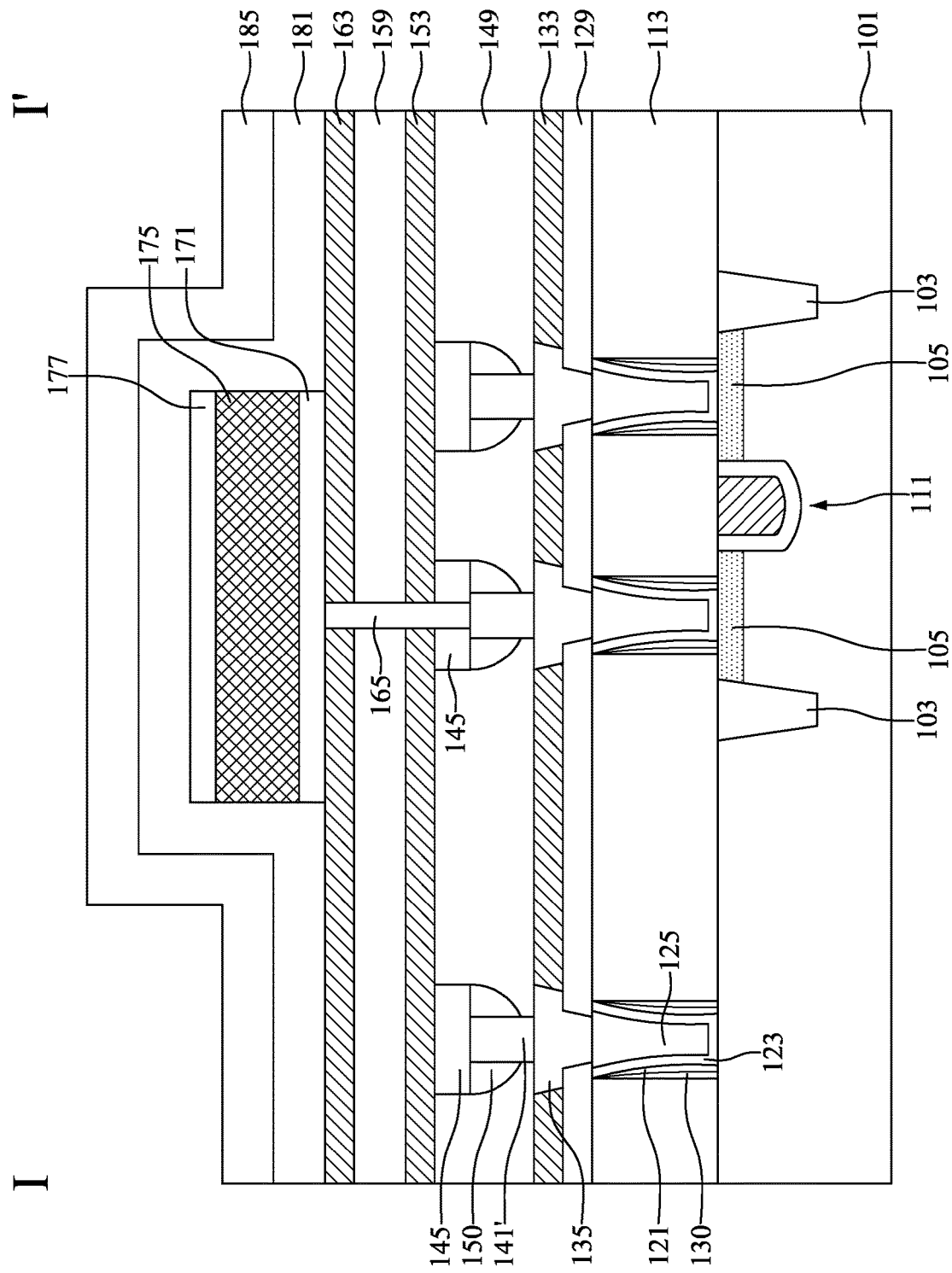
FIG. 20 is a cross-sectional view illustrating an intermediate stage in the formation of another semiconductor device along the sectional line I-I' in FIG. 1, in accordance with some embodiments.
Figure 21:
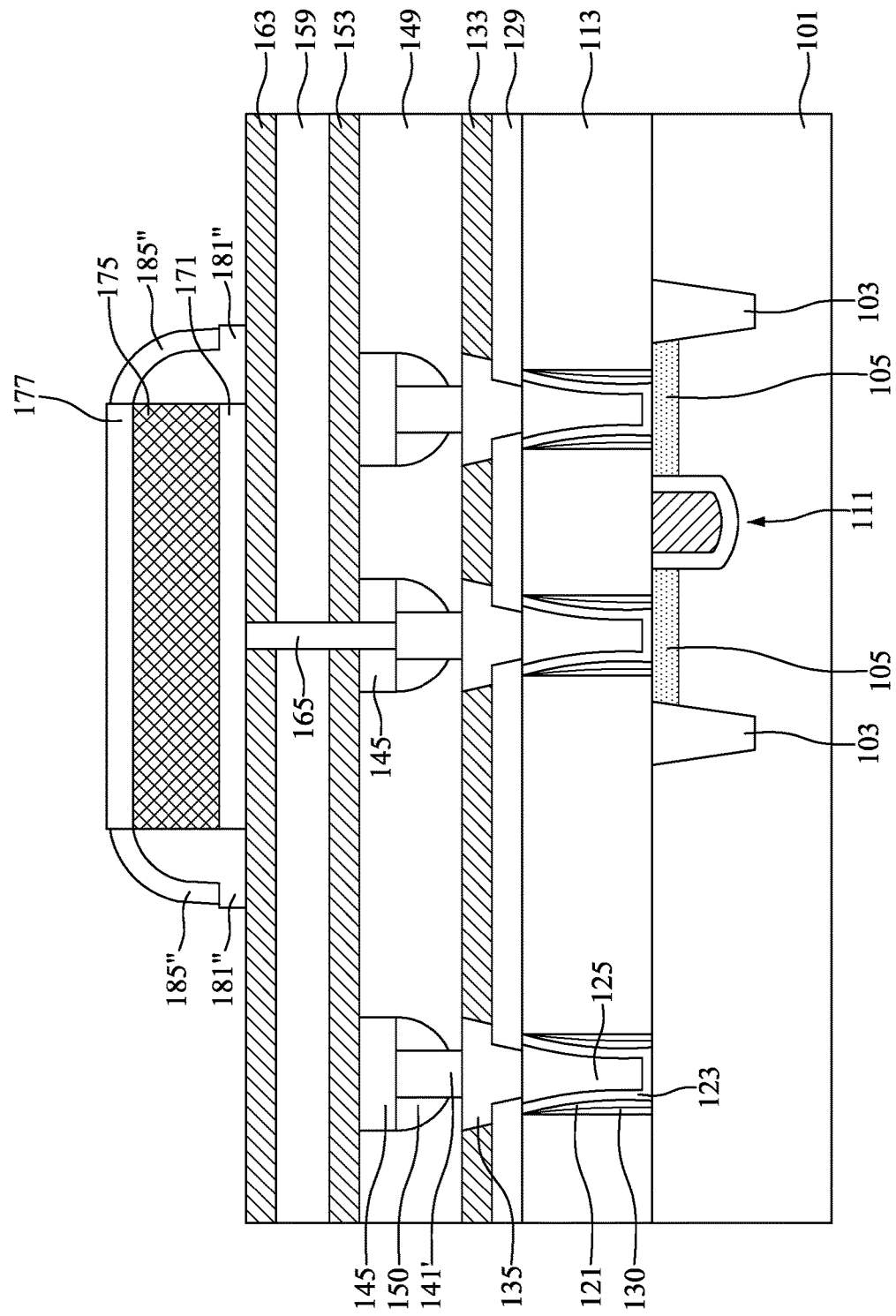
FIG. 21 is a cross-sectional view illustrating an intermediate stage in the formation of another semiconductor device along the sectional line I-I' in FIG. 1, in accordance with some other embodiments.
Figure 22:
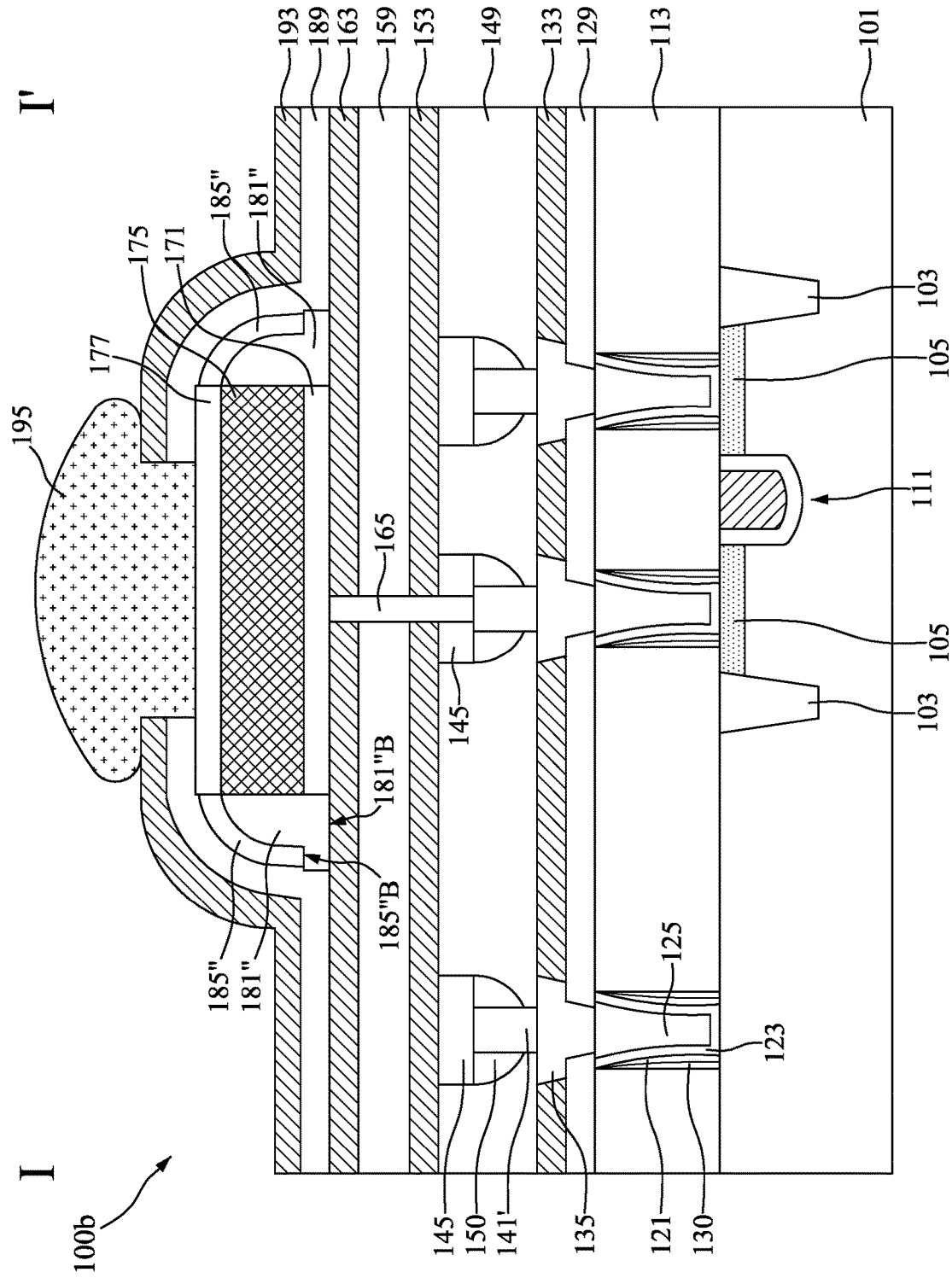
FIG. 22 is a cross-sectional view illustrating an intermediate stage in the formation of another semiconductor device along the sectional line I-I' in FIG. 1, in accordance with some other embodiments.

FIGS. 20 to 22 are cross-sectional views along the sectional line I-I' in FIG. 1 illustrating intermediate stages in the formation of the semiconductor device 100*b*, in accordance with some embodiments. In some embodiments, the layout of the semiconductor device 100*b* is similar to, or the same as, the layout of the semiconductor device 100*a*, as shown in FIG. 1.

Some processes and materials used to form the semiconductor device 100*b* are similar to, or the same as, those used to form the semiconductor device 100*a*, and similar descriptions are not repeated herein. The difference between the second embodiment in FIGS. 20 to 22 and the first embodiment in FIGS. 2 and 4 to 19 lies in the method for forming the spacers over the sidewalls 175S of the bonding pad 175.

As shown in FIG. 20, the third spacer layer 185 is formed so as to conformally cover the structure shown in FIG. 15, in accordance with some embodiments. In the present embodiment, the third spacer layer 185 is formed over the second spacer layer 181. In other words, the third spacer layer 185 is formed before the second spacer layer 181 is etched to form spacers.

Next, the third spacer layer 185 is etched to form third spacers 185", and the underlying second spacer layer 181 is etched to form second spacers 181" using the third spacers 185" as a mask, as shown in FIG. 21 in accordance with some embodiments. In other words, the second spacers 181" are formed after the third spacers 185" in accordance with some embodiments, such that the third spacers 185" are separated from the dielectric layer 163 by a portion of the second spacers 181".

After the second and third spacers 181" and 185" are formed, the passivation layers 189 and 193 and the conductive bump 195 are formed in a manner similar to that of the semiconductor device 100a, as shown in FIG. 22 in accordance with some embodiments. It should be noted that, in some embodiments, since the second spacers 181" are formed using the third spacers 185" as a mask, one of the processes for forming masks may be omitted, and the cost of forming the semiconductor device may be accordingly reduced. In addition, the bottommost surface 185"B of the third spacers 185" is higher than the bottommost surface 181"B of the second spacers 181", in accordance with some embodiments.

Embodiments of semiconductor devices 100a and 100b and methods for preparing the same are provided. The semiconductor devices 100a and 100b include the second spacers 181' or 181" over the sidewalls 175S of the bonding pad 175, the passivation layer (e.g., the passivation layer 189 or 193) covering the bonding pad 175 and the second spacers 181' or 181", and the conductive bump 195 over the passivation layer and electrically connected to one of the S/D regions 105 in the semiconductor substrate 101 through the bonding pad 175. Therefore, short circuiting between the bonding pad 175 and adjacent bonding pads caused by misalignment of the bonding pad 175 and the conductive bump 195 may be prevented by the second spacers 181' or 181". As a result, the overall device performance may be improved, and the yield rate of the semiconductor devices 100a and 100b may be increased.

In addition, since the dielectric layers (e.g., the dielectric layers 133, 153 and 163) and the passivation layer 193 may include silicon-rich oxide (SRO), the semiconductor devices 100a and 100b may be protected from being contaminated by the external moisture.

Figure 23:
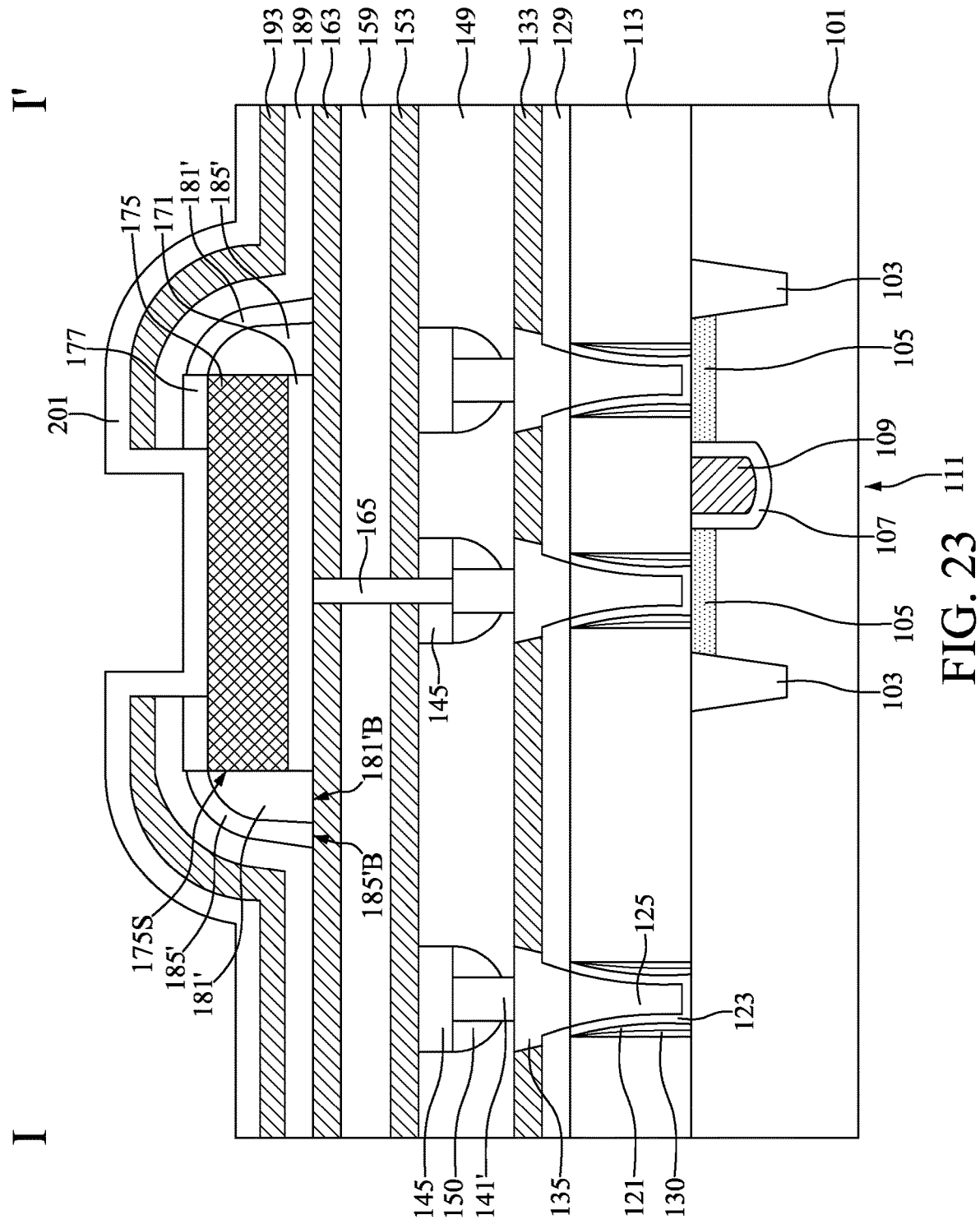
FIGS. 23 to 25 are cross-sectional views illustrating intermediate stages in the formation of a semiconductor device, in accordance with some embodiments
Figure 24:
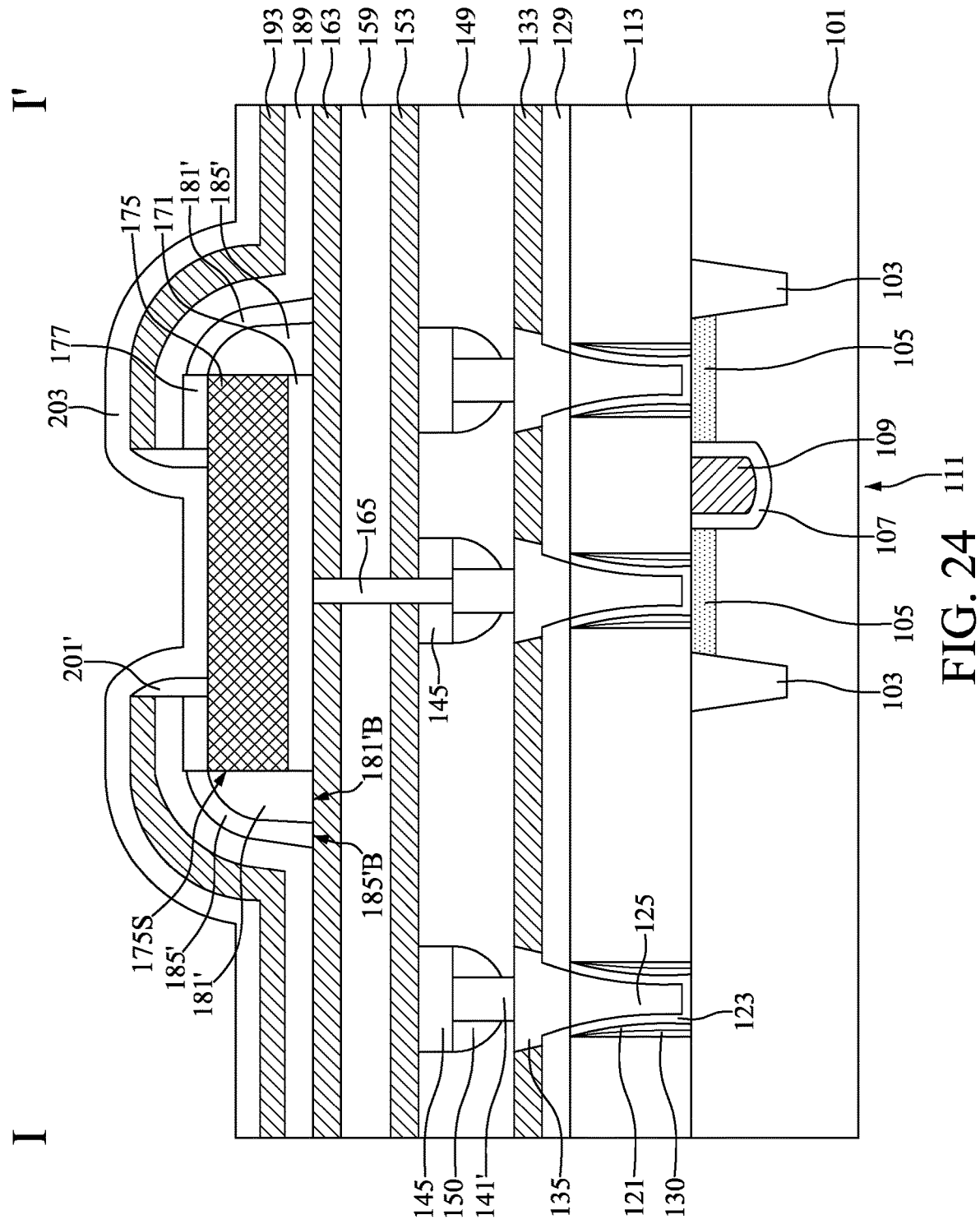
Figure 25:
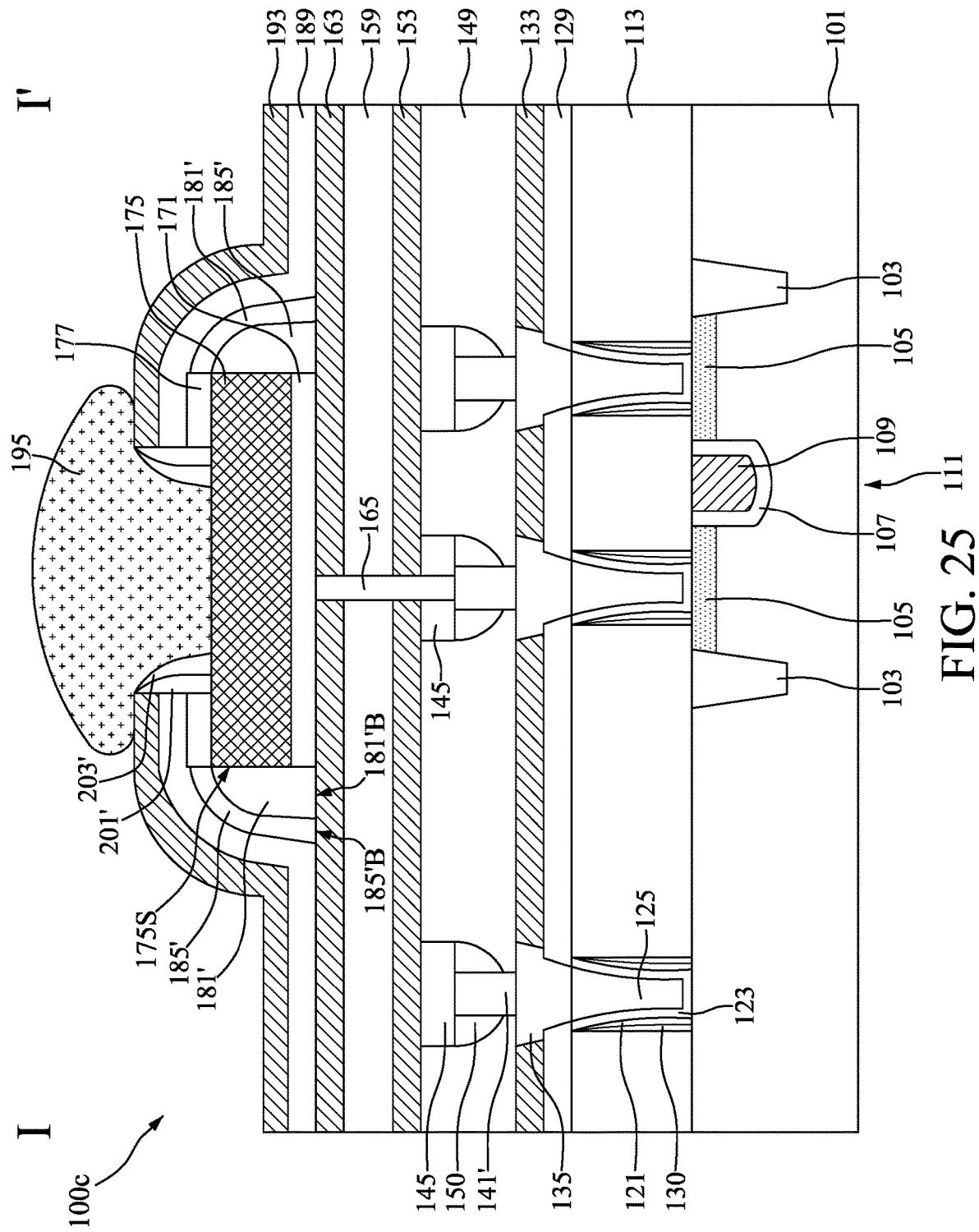

FIGS. 23 to 25 are cross-sectional views illustrating intermediate stages in the formation of a semiconductor device 100c, in accordance with some embodiments. Some processes and materials used to form the semiconductor device 100c are similar to, or the same as, those used to form the semiconductor device 100a, and similar descriptions are not repeated herein. The difference between the third embodiment in FIGS. 23 to 25 and the first embodiment in FIGS. 2 and 4 to 19 lies in the method for forming the spacers over the top surface of the bonding pad 175.

As shown in FIG. 23, a spacer layer 201 is formed so as to conformally cover the structure before the conductive bump 195 is formed, in accordance with some embodiments. In the present embodiment, the spacer layer 201 is formed over the passivation layer 193 and the bonding pad 175. Next, the spacer layer 201 is etched to form a spacer 201' disposed over a top surface of the bonding pad 175, as shown in FIG. 24 in accordance with some embodiments. In some embodiments, the spacer 201' covers the sidewalls of the anti-reflection coating layer 177 and the passivation layers 189 and 193, serving as a sidewall protection spacer.

Subsequently, referring to FIG. 24, a spacer layer 203 is formed so as to conformally cover the structure shown in FIG. 23, in accordance with some embodiments. In the present embodiment, the spacer layer 203 is formed over the passivation layer 193, the bonding pad 175, and the spacer 201'. Next, the spacer layer 203 is etched to form a spacer 203' disposed over the spacer 201' and the top surface of the bonding pad 175 as shown in FIG. 25. In some embodiments, the spacer 201' covers the sidewalls of the anti-reflection coating layer 177 and the passivation layers 189 and 193, i.e., the spacer 201' serves as a primary sidewall protection spacer, and the spacer 203' serves as a secondary sidewall protection spacer. After the spacers 201' and 203' are formed, the conductive bump 195 is formed in a manner similar to that of the semiconductor device 100c in accordance with some embodiments.

It should be noted that the materials of the spacer layer 201 and the spacer layer 203 are different. For example, in some embodiments, the spacer layer 201 is made of oxide, and the spacer layer 203 is made of nitride. In some other embodiments, the spacer layer 201 is made of nitride, and the spacer layer 203 is made of oxide. In addition, the second spacers 181' and/or the third spacers 185' over the sidewalls 175S of the bonding pad 175 in FIG. 25 may be replaced by the second spacers 181" and/or the third spacers 185" shown in FIG. 22.

Figure 26:
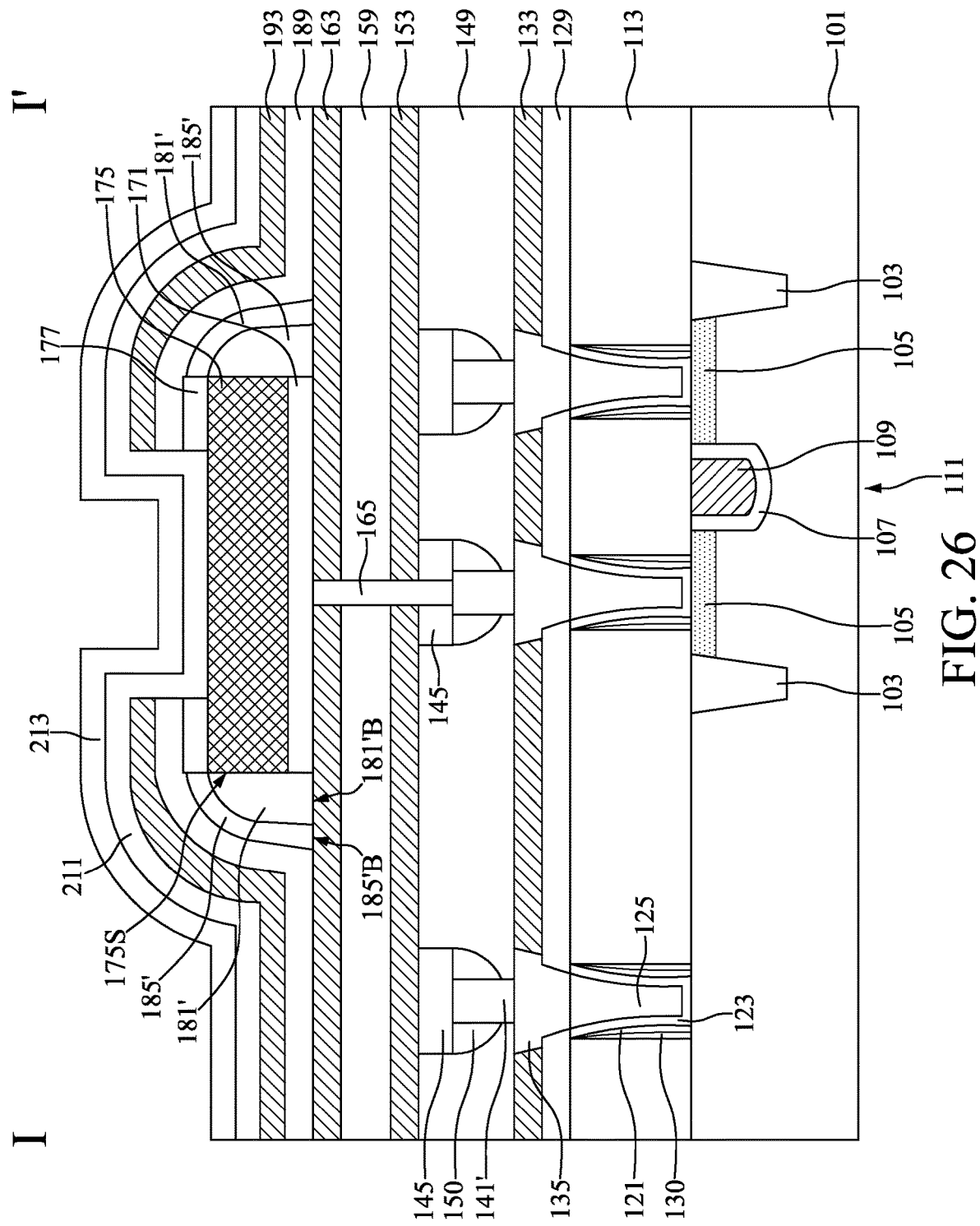
FIGS. 26 to 28 are cross-sectional views illustrating intermediate stages in the formation of a semiconductor device, in accordance with some embodiments
Figure 27:
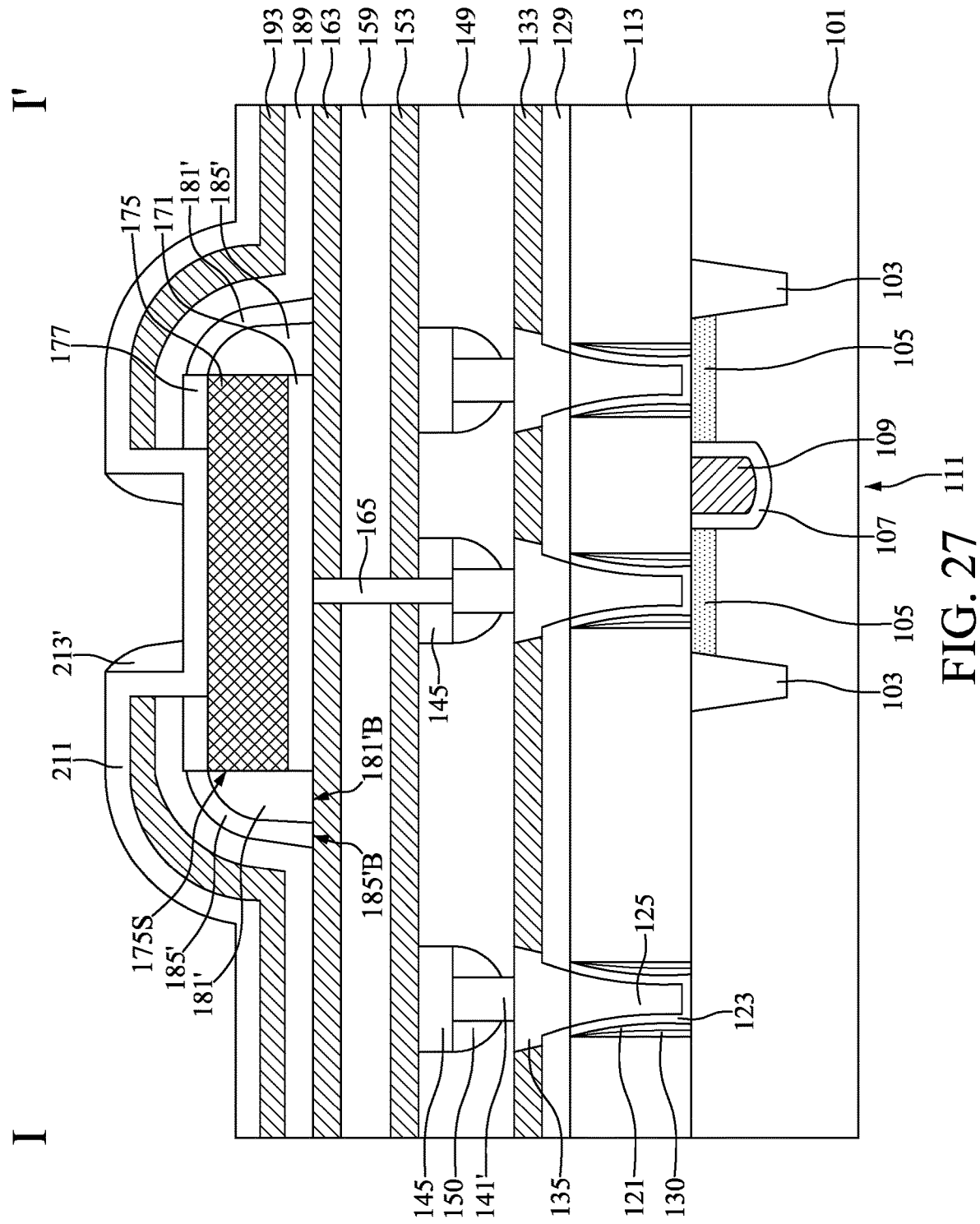
Figure 28:
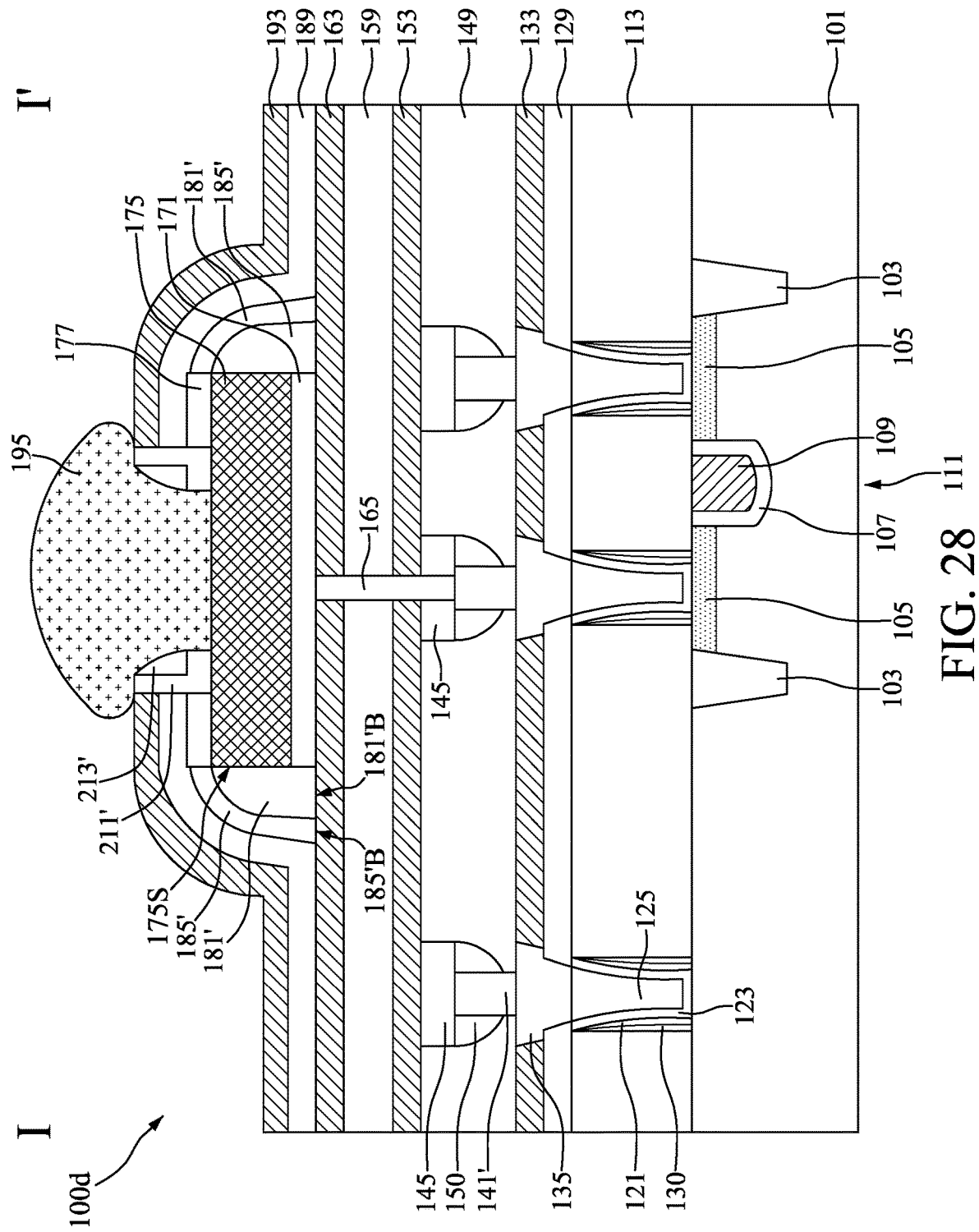

FIGS. 26 to 28 are cross-sectional views illustrating intermediate stages in the formation of a semiconductor device 100d, in accordance with some embodiments. Some processes and materials used to form the semiconductor device 100d are similar to, or the same as, those used to form the semiconductor device 100c, and similar descriptions are not repeated herein. The difference between the fourth embodiment in FIGS. 26 to 28 and the third embodiment in FIGS. 23 to 25 lies in the method for forming the spacers over the top surface of the bonding pad 175.

As shown in FIG. 26, a spacer layer 211 is formed so as to conformally cover the structure before the conductive bump 195 is formed, in accordance with some embodiments. In the present embodiment, the spacer layer 201 is formed over the passivation layer 193 and the bonding pad 175. Subsequently, a spacer layer 213 is formed so as to conformally cover the spacer layer 211.

Referring to FIG. 27, the spacer layer 213 is etched to form a spacer 213' disposed over the spacer layer 211. Next, the spacer layer 211 is etched to form a spacer 211' over the bonding pad 175, as shown in FIG. 28.

Subsequently, referring to FIG. 28, after the spacers 211' and 213' are formed, the conductive bump 195 is formed in a manner similar to that of the semiconductor device 100d in accordance with some embodiments. In some embodiments, the spacer 211' covers the sidewalls of the anti-reflection coating layer 177 and the passivation layers 189 and 193, i.e., the spacer 211' serves as a primary sidewall protection spacer, and the spacer 213' serves as a secondary sidewall protection spacer. In addition, the spacer 211' can be considered a dielectric liner between the spacer 213' and the bonding pad 175.

It should be noted that the materials of the spacer layer 211 and the spacer layer 213 are different. For example, in some embodiments, the spacer layer 211 is made of oxide, and the spacer layer 213 is made of nitride. In some other embodiments, the spacer layer 211 is made of nitride, and the spacer layer 213 is made of oxide. In addition, the second spacers 181' and/or the third spacers 185' over the sidewalls 175S of the bonding pad 175 in FIG. 25 may be replaced by the second spacers 181" and/or the third spacers 185" shown in FIG. 22.

In one embodiment of the present disclosure, a semiconductor device is provided. The semiconductor device includes a bonding pad disposed over a semiconductor substrate; a first spacer disposed over a top surface of the bonding pad; a second spacer disposed over a sidewall of the bonding pad; a dielectric layer between the bonding pad and the semiconductor substrate, wherein the dielectric layer includes silicon-rich oxide; and a conductive bump disposed over the first passivation layer, wherein the conductive bump is electrically connected to a source/drain (S/D) region in the semiconductor substrate through the bonding pad.

In another embodiment of the present disclosure, a semiconductor device is provided. The semiconductor device includes a bonding pad disposed over a semiconductor substrate; a first spacer disposed over a top surface of the bonding pad; a second spacer disposed over a sidewall of the bonding pad; a third spacer disposed over the second spacer; a first dielectric layer between the bonding pad and the semiconductor substrate, wherein the dielectric layer includes silicon-rich oxide; and a conductive bump disposed over the bonding pad, wherein the conductive bump extends over the first passivation layer and is electrically connected to a source/drain (S/D) region in the semiconductor substrate.

In another embodiment of the present disclosure, a semiconductor device is provided. The semiconductor device includes a bonding pad disposed over a semiconductor substrate; a first upper spacer disposed over a top surface of the bonding pad; a second upper spacer disposed over the first upper spacer; a first sidewall spacer disposed over a sidewall of the bonding pad; a dielectric layer between the bonding pad and the semiconductor substrate, wherein the dielectric layer includes silicon-rich oxide; and a conductive bump disposed over the first passivation layer, wherein the conductive bump is electrically connected to a source/drain (S/D) region in the semiconductor substrate through the bonding pad.

Embodiments of a semiconductor device are provided in accordance with some embodiments of the disclosure. The semiconductor device includes a second spacer over a sidewall of a bonding pad, a first passivation layer covering the bonding pad and the second spacer, and a conductive bump over the first passivation layer and electrically connected to a source/drain region in an underlying semiconductor substrate through the bonding pad. As a result of such configuration, short circuit problems caused by misalignment of the bonding pad and the conductive bump may be prevented by the second spacer. Accordingly, the overall device performance may be improved, and the yield rate of the semiconductor device may be increased.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
   a bonding pad disposed over a semiconductor substrate;
   a first spacer disposed over a top surface of the bonding pad;
   a second spacer disposed over a sidewall of the bonding pad;
   a dielectric layer between the bonding pad and the semiconductor substrate, wherein the dielectric layer includes silicon-rich oxide;
   a conductive bump disposed over the first passivation layer, wherein the conductive bump is electrically connected to a source/drain (S/D) region in the semiconductor substrate through the bonding pad;
   a dielectric liner disposed between the first spacer and the bonding pad; and
   a first passivation layer covering the second spacer;
   wherein the dielectric liner is L-shaped, and the first spacer is separated from the bonding pad by the dielectric liner.

2. The semiconductor device of claim 1, further comprising:
   a barrier layer disposed between the bonding pad and the dielectric layer, wherein the second spacer is in direct contact with the barrier layer and the dielectric layer.

3. The semiconductor device of claim 1, further comprising:
   an anti-reflection coating layer disposed over the bonding pad; and
   a third spacer disposed over the second spacer and in direct contact with the anti-reflection coating layer, wherein the anti-reflection coating layer and the third spacer are covered by the first passivation layer.

4. The semiconductor device of claim 3, wherein a bottommost surface of the third spacer is level with or higher than a bottommost surface of the second spacer.

5. The semiconductor device of claim 1, further comprising:
   a second passivation layer between the first passivation layer and the bonding pad, wherein the second spacer is covered by the second passivation layer, and a portion of the conductive bump is surrounded by the first passivation layer and the second passivation layer.

6. The semiconductor device of claim 1, further comprising:
   a conductive via between the bonding pad and the S/D region, wherein the conductive via is surrounded by an air gap.

7. A semiconductor device, comprising:
   a bonding pad disposed over a semiconductor substrate;
   a first upper spacer disposed over a top surface of the bonding pad;
   a second upper spacer disposed over the first upper spacer;
   a first sidewall spacer disposed over a sidewall of the bonding pad;
   a dielectric layer between the bonding pad and the semiconductor substrate, wherein the dielectric layer includes silicon-rich oxide; and
   a conductive bump disposed over the first passivation layer, wherein the conductive bump is electrically connected to a source/drain (S/D) region in the semiconductor substrate through the bonding pad.

8. The semiconductor device of claim 7, further comprising:
   an anti-reflection coating layer disposed over the bonding pad; and
   a second sidewall spacer disposed over the first sidewall spacer and in direct contact with the anti-reflection coating layer, wherein the anti-reflection coating layer and the second sidewall spacer are covered by the first passivation layer.

9. The semiconductor device of claim 8, wherein a bottommost surface of the second sidewall spacer is level with or higher than a bottommost surface of the first sidewall spacer.

10. The semiconductor device of claim 8, further comprising:
   a second passivation layer between the first passivation layer and the bonding pad, wherein the first sidewall spacer is covered by the second passivation layer, and a portion of the conductive bump is surrounded by the first passivation layer and the second passivation layer.

11. The semiconductor device of claim 8, further comprising:
   a conductive via between the bonding pad and the S/D region, wherein the conductive via is surrounded by an air gap.

* * * * *